(12) United States Patent
Harada et al.

(10) Patent No.: US 8,963,327 B2
(45) Date of Patent: Feb. 24, 2015

(54) SEMICONDUCTOR DEVICE INCLUDING WIRING BOARD WITH SEMICONDUCTOR CHIP

(71) Applicant: Renesas Electronics Corporation, Kawasaki, Kanagawa (JP)

(72) Inventors: Kozo Harada, Kawasaki (JP); Shinji Baba, Kawasaki (JP); Masaki Watanabe, Kawasaki (JP); Satoshi Yamada, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/872,012

(22) Filed: Apr. 26, 2013

(65) Prior Publication Data
US 2013/0299970 A1 Nov. 14, 2013

(30) Foreign Application Priority Data
May 11, 2012 (JP) .................. 2012-109309

(51) Int. Cl.
*H01L 23/498* (2006.01)
*H01L 21/56* (2006.01)
(Continued)

(52) U.S. Cl.
CPC .... *H01L 23/49811* (2013.01); *H01L 23/49827* (2013.01); *H01L 23/49838* (2013.01); *H01L 21/563* (2013.01); *H01L 24/14* (2013.01); *H01L 23/3677* (2013.01); *H01L 23/50* (2013.01); *H01L 2224/32225* (2013.01); *H01L 2224/73204* (2013.01); *H01L 2924/15311* (2013.01); *H01L 2224/14152* (2013.01); *H01L 2224/14154* (2013.01); *H01L 24/13* (2013.01); *H01L 24/16* (2013.01); *H01L 2224/13082* (2013.01); *H01L 2224/131* (2013.01); *H01L 2224/13147* (2013.01); *H01L 2224/16237* (2013.01); *H01L 2924/13091* (2013.01)
USPC ........... 257/737; 257/738; 257/734; 257/778; 257/779; 257/773; 257/774; 257/780; 257/782

(58) Field of Classification Search
CPC ............ H01L 123/49827; H01L 2/563; H01L 2224/73204; H01L 2224/26225; H01L 2224/32225; H01L 2224/15311; H01L 2224/16225; H01L 2924/00
USPC ......... 257/737, 738, 734, 778, 779, 773, 774, 257/780, 782
See application file for complete search history.

(56) References Cited

U.S. PATENT DOCUMENTS

| 8,435,834 B2 * | 5/2013 | Pagaila et al. ................. 438/106 |
| 2007/0096338 A1 | 5/2007 | Kim et al. |

(Continued)

FOREIGN PATENT DOCUMENTS

| JP | 2005-252074 A | 9/2005 |
| JP | 2007-081374 A | 3/2007 |

(Continued)

*Primary Examiner* — Alexander Oscar Williams
(74) *Attorney, Agent, or Firm* — McDermott Will & Emery LLP

(57) ABSTRACT

A semiconductor device includes lands having an NSMD (non-solder mask defined) structure for mounting thereon solder balls placed in an inner area of a chip mounting area. The lands for mounting thereon solder balls are placed in an area of the back surface of a through-hole wiring board overlapping with a chip mounting area in a plan view. The semiconductor device is mounted on a mounting substrate with the balls.

16 Claims, 26 Drawing Sheets

(51) Int. Cl.
*H01L 23/00* (2006.01)
*H01L 23/367* (2006.01)
*H01L 23/50* (2006.01)

(56) References Cited

U.S. PATENT DOCUMENTS

| | | | |
|---|---|---|---|
| 2008/0185717 A1* | 8/2008 | Sasaki | 257/737 |
| 2009/0017582 A1* | 1/2009 | Masumoto | 438/127 |
| 2009/0309212 A1* | 12/2009 | Shim et al. | 257/700 |
| 2010/0258953 A1 | 10/2010 | Takeda | |
| 2011/0095418 A1* | 4/2011 | Lim et al. | 257/737 |
| 2012/0286418 A1* | 11/2012 | Lee et al. | 257/737 |
| 2012/0307445 A1* | 12/2012 | Lee et al. | 361/679.32 |
| 2012/0326297 A1* | 12/2012 | Choi et al. | 257/737 |
| 2013/0134581 A1* | 5/2013 | Lin et al. | 257/737 |
| 2013/0147035 A1* | 6/2013 | Chen et al. | 257/737 |
| 2013/0249076 A1* | 9/2013 | Lee et al. | 257/737 |
| 2013/0270230 A1* | 10/2013 | Cheung et al. | 219/121.6 |
| 2013/0341786 A1* | 12/2013 | Hsu et al. | 257/737 |
| 2014/0027904 A1* | 1/2014 | Kusanagi | 257/737 |
| 2014/0127863 A1* | 5/2014 | Lin et al. | 438/121 |
| 2014/0131856 A1* | 5/2014 | Do et al. | 257/737 |
| 2014/0151877 A1* | 6/2014 | Lim et al. | 257/737 |

FOREIGN PATENT DOCUMENTS

| | | |
|---|---|---|
| JP | 2009-021366 A | 1/2009 |
| JP | 2010-245455 A | 10/2010 |
| JP | 2010-287646 A * | 12/2010 |

* cited by examiner

THWB

UF(NCP)

THWB

SEMICONDUCTOR DEVICE INCLUDING WIRING BOARD WITH SEMICONDUCTOR CHIP

CROSS-REFERENCE TO RELATED APPLICATIONS

The disclosure of Japanese Patent Application No. 2012-109309 filed on May 11, 2012 including the specification, drawings and abstract is incorporated herein by reference in its entirety.

BACKGROUND

The present invention relates to a semiconductor device. The invention relates to, for example, a technology effective when applied to a technology of mounting, on a mounting substrate, a wiring board having thereon a semiconductor chip via a ball to be coupled to a land placed on the back surface of the wiring board.

Japanese Patent Laid-Open No. 2007-81374 (Patent Document 1) describes a technology in which a plurality of bonding pads formed on a substrate are comprised of a plurality of NSMD (Non-Solder Mask Defined) bonding pads and a plurality of SMD (Solder Mask Defined) bonding pads alternately arranged on one surface of the substrate.

Japanese Patent Laid-Open No. 2010-245455 (Patent Document 2) describes the following technology. Described specifically, among two or more pads, a pad formed on a corner portion is covered, at a first peripheral edge on the side of the corner portion far from the center of the base material of the pad, with a solder resist. On the other hand, a second peripheral edge on the side closer to the center of the base material than the first periphery is exposed from the solder resist.

According to Japanese Patent Laid-Open No. 2009-21366 (Patent Document 3), a plurality of first electrode pads is placed in an area of the back surface of a wiring board overlapping with a semiconductor chip in a plan view and a plurality of second electrode pads is placed in an area not overlapping with the semiconductor chip in a plan view. At this time, the first electrode pads and the second electrode pads are exposed from an opening provided in an insulating film. The first electrode pads are covered, at the peripheral edge thereof, with an insulating film, while the profile of the second electrode pads is smaller than the opening portion.

Japanese Patent Laid-Open No. 2005-252074 (Patent Document 4) describes the following technology. Described specifically, a plurality of electrode pads placed on the back surface of a wiring board is exposed from an opening portion provided in an insulating film. The electrode pads include a first electrode pad having a profile smaller than the opening portion and a second electrode pad covered at the peripheral edge thereof with an insulating film. At this time, the second electrode pad is placed at least at a position most distant from a semiconductor chip.

PATENT DOCUMENTS

[Patent Document 1] Japanese Patent Laid-Open No. 2007-81374
[Patent Document 2] Japanese Patent Laid-Open No. 2010-245455
[Patent Document 3] Japanese Patent Laid-Open No. 2009-21366
[Patent Document 4] Japanese Patent Laid-Open No. 2005-252074

SUMMARY

For example, a semiconductor device having a wiring board on which a semiconductor chip is mounted is coupled to a mounting substrate via a ball. This means that the wiring board has, on the back surface thereof, a plurality of lands and a plurality of balls is placed so as to be coupled to the lands. The wiring board is mounted on the mounting substrate via these balls. In a reliability test (temperature cycling test after mounting) conducted after the semiconductor device is mounted on the mounting substrate, fracture and separation of a ball placed in an area of the back surface of the wiring board overlapping with a mounting area of the semiconductor chip in a plan view have become a problem.

The other problem and novel features of the invention will be apparent from the description herein and accompanying drawings.

According to First Embodiment, a wiring board (through-hole wiring board) having thereon a semiconductor chip has, on the back surface thereof, a plurality of lands to be coupled to a plurality of balls, respectively. A plurality of first lands, among the lands, placed in an area overlapping with the semiconductor chip in a plan view is embraced in a plurality of opening portions provided in an insulating film.

First Embodiment makes it possible to improve the reliability of a semiconductor device to be mounted on a mounting substrate, for example, by using a ball.

DETAILED DESCRIPTION

Figure 1:
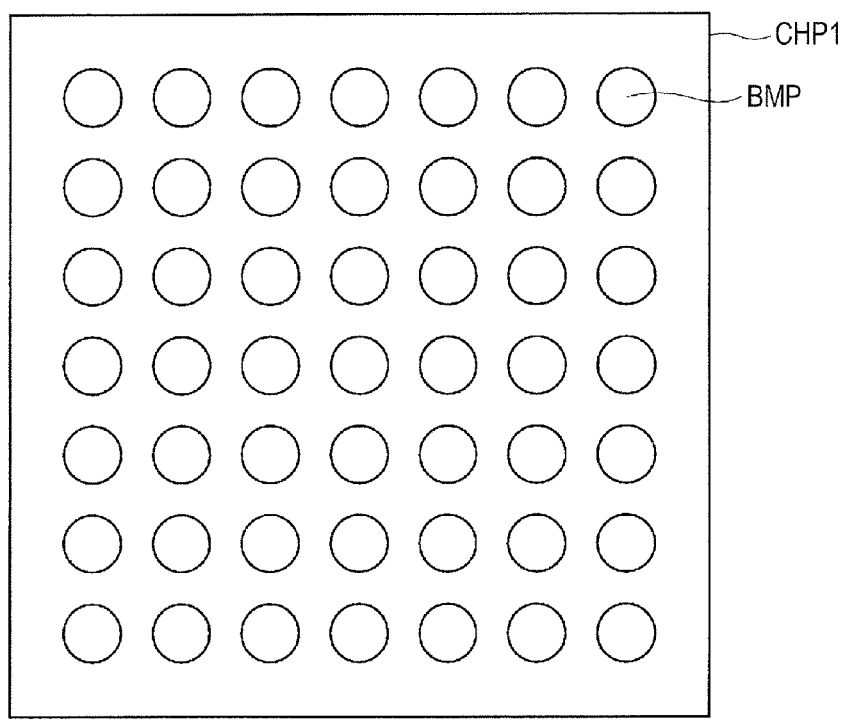
FIG. 1 is a top view showing the configuration of the appearance of a semiconductor chip according to a first related technology.

In the following embodiment, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

In the below-described embodiments, when a reference is made to the number of elements (including the number, value, amount, range, or the like), the number is not limited to a specific number but may be greater than or less than the specific number, unless otherwise specifically indicated or principally apparent that the number is limited to the specific number.

Further, in the below-described embodiments, it is needless to say that the constituent elements (including element steps or the like) are not always essential unless otherwise specifically indicated or principally apparent that they are essential.

Similarly, in the below-described embodiments, when a reference is made to the shape, positional relationship, or the like of the constituent elements, that substantially approximate or similar to it is also embraced unless otherwise specifically indicated or principally apparent that it is not. This also applies to the above-described value and range.

In all the drawings for describing the below-described embodiment, members of a like function will be identified by like reference numerals in principle and descriptions will not be repeated. To facilitate viewing of the drawings, some plan views may be hatched.

<Description on First Related Technology>

For example, a semiconductor device is comprised of a semiconductor chip in which a semiconductor element such as MOSFET (Metal Oxide Semiconductor Field Effect Transistor) and a multilayer wiring have been formed and a package formed to cover this semiconductor chip. The package has (1) a function of electrically coupling the semiconductor element formed on the semiconductor chip to an external circuit and (2) a function of protecting the semiconductor chip from outside circumstances such as humidity and temperature and preventing breakage due to oscillation or impact and deterioration in the properties of the semiconductor chip. Further, the package also has (3) a function of facilitating handling of the semiconductor chip and (4) a function of releasing heat upon operation of the semiconductor chip and thereby allows the semiconductor element to exhibit its function fully. There are various kinds of packages having such functions.

First, the first related technology investigated by the present inventors will be described referring to some drawings. FIG. 1 is a top view showing the configuration of the appearance of a semiconductor chip CHP1 investigated by the present inventors. As shown in FIG. 1, the semiconductor chip CHP1 is rectangular and has bump electrodes BMP, which are external coupling terminals, throughout the surface of the semiconductor chip CHP1. A semiconductor device according to the first related technology investigated by the present inventors can be obtained by packaging the semiconductor chip CHP1 having such a configuration.

Figure 2:
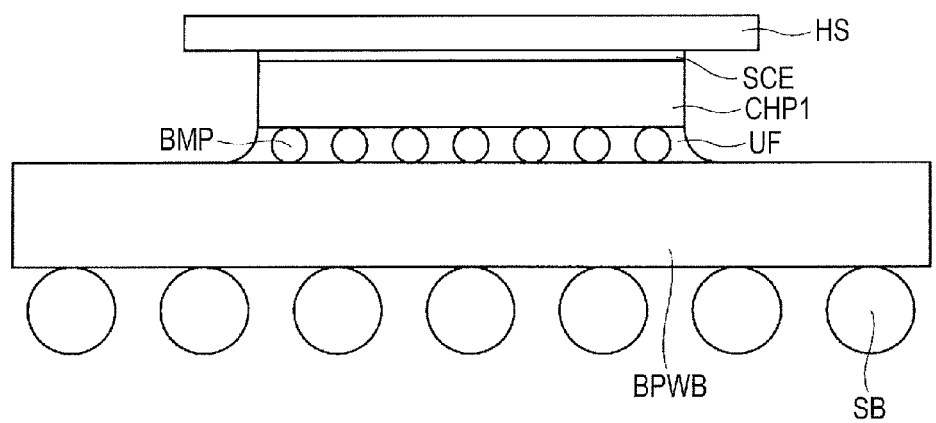
FIG. 2 is a side view showing the configuration of a semiconductor device according to the first related technology.

FIG. 2 is a side view showing the configuration of the semiconductor device according to the first related technology investigated by the present inventors. As shown in FIG. 2, the semiconductor device investigated by the present inventors has a buildup wiring board BPWB and this buildup wiring board BPWB has, on the back surface (lower surface) thereof, a plurality of solder balls SB. The buildup wiring board BPWB has, on the surface (upper surface) thereof, the semiconductor chip CHP1. Here, the semiconductor chip CHP1 is placed on the buildup wiring board BPWB so that a plurality of bump electrodes formed on the semiconductor chip CHP1 are electrically coupled to terminals (not illustrated) formed on the surface of the buildup wiring board BPWB. A space formed between the semiconductor chip CHP1 and the buildup wiring board BPWB is filled with an underfill UF which is a sealing resin. This underfill UF is often made of an epoxy resin and is used for ensuring coupling reliability between the semiconductor chip CHP1 and the buildup wiring board BPWB. The semiconductor chip CHP1 has, on the upper surface thereof, a heat sink HS via a silicone resin SCE. This heat sink HS is provided in order to efficiently release the heat generated from the semiconductor chip CHP1 to the outside. In short, the heat sink HS is provided in order to improve the heat dissipation efficiency of the semiconductor chip CHP1.

Figure 3:
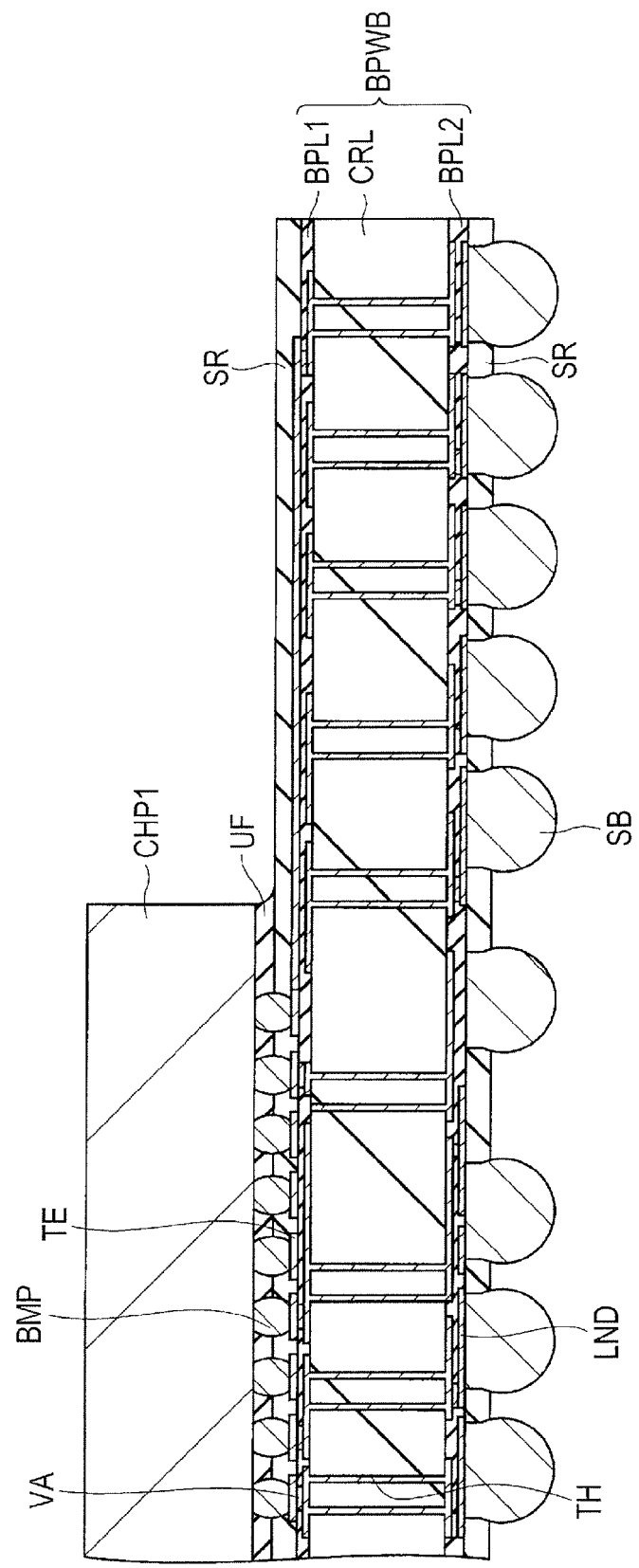
FIG. 3 shows a portion of the semiconductor device according to the first related technology and also shows an internal structure of a buildup wiring board.

The semiconductor device investigated by the present inventors and having such a configuration, particularly an internal structure of the buildup wiring board PBWB, will next be described more specifically. FIG. 3 shows a portion of the semiconductor device investigated by the present inventors and it shows the internal structure of the buildup wiring board BPWB. As shown in FIG. 3, the buildup wiring board BPWB is comprised of a core layer CRL and a buildup layer BPL1 and a buildup layer BPL2 placed to sandwich this core layer CRL therebetween.

More specifically, the core layer CRL has therein a through-hole TH and the buildup layer BPL1 has a multilayer wiring (two layers in FIG. 3) to be coupled to this through-hole TH. The wirings of this multilayer wiring are coupled to each other through a via VA formed in the buildup layer BPL1. The buildup layer BPL1 has, on the surface thereof, a solder resist SR and from an opening provided in this solder resist SR, a terminal TE configuring the buildup layer BPL1 is exposed. The semiconductor chip CHP1 is mounted on the buildup wiring board BPWB so as to electrically couple this terminal TE and the bump electrode BMP to each other.

On the other hand, the buildup layer BPL2 also has a multilayer wiring (two layers in FIG. 3) to be coupled to the through-hole TH formed in the core layer CRL. This buildup layer BPL2 has, on the surface thereof, a solder resist SR and a land LND (back surface terminal) configuring the buildup layer BPL2 is exposed from an opening provided in this solder resist SR. A solder ball SB is mounted on the land LND so as to be electrically coupled to this land LND. More specifically, in the buildup wiring board BPWB as shown in FIG. 3, the thickness of the wiring board, that is, a total thickness of the core layer CRL (about 0.8 mm), the buildup layer BPL1, and the buildup layer BPL2 is about 1.0 mm, the diameter of the through-hole TH is from about 150 to 250 µm, and the diameter of the via VA is about 50 µm.

The buildup wiring board BPWB having such a configuration has an advantage that it is easy to form fine-pitch wiring, responding to an increase in the density of bump electrodes BMP formed on the semiconductor chip CHP1. Described specifically, the buildup wiring board BPWB has the buildup layer BPL1 and the buildup layer BPL2 so as to sandwich the core layer CRL therebetween. A microvia VA is formed in the buildup layer BPL1 or the buildup layer BPL2 and this via VA can be placed freely. In addition, a terminal TE may be placed on this microvia VA.

The reason of it will next be described. The microvia formed in the buildup layer BPL1 or the buildup layer BPL2 has a fine diameter so that the microvia VA can be filled with a conductor film easily. As a result, the upper portion of the microvia VA can be covered with the conductor film so that even if a terminal TE is placed on the microvia VA, secure coupling can be realized between the microvia VA and the terminal TE. Thus, the buildup wiring board BPWB has an advantage that since the terminal TE can be placed on the microvia VA, there are not many restrictions on the formation of wirings and fine-pitch wiring can be formed easily.

Further, as shown in FIG. 3, in the buildup wiring board BPWB, a plating film is formed on the wall surface of the through-hole TH formed in the core layer CRL, but the plating film is not formed inside the through-hole TH because the through-hole TH has a large diameter. As shown in FIG. 3, however, a hole filling resin is buried in the through-hole TH and the through-hole TH is filled with it. In the buildup wiring board BPWB shown in FIG. 3, a microvia VA or wiring may be placed even on the through-hole TH. From this standpoint, the number of limitations on the formation of wirings decrease, which makes it easy to form fine-pitch wiring.

As a result of the investigation, however, the present inventors have found that there is a room for improvement as shown below in the above-mentioned buildup wiring board BPWB. For example, as the semiconductor device operates, the semiconductor chip CHP1 generates heat. The heat thus generated transfers from the semiconductor chip CHP1 to the buildup wiring board BPWB. The heat thus applied to the buildup wiring board BPWB expands the buildup wiring board BPWB. Excessive expansion of the buildup wiring board BPWB may put a stress on a sealing resin (underfill UF), which seals the space between the buildup wiring board BPWB and the semiconductor chip CHP1, cause cracks at the interface between the semiconductor chip and the sealing resin or at the interface between the sealing resin and the buildup wiring board, and deteriorate the reliability of a semiconductor device.

In order to reduce the thermal expansion coefficient ($\alpha$) of the buildup wiring board BPWB (in order to bring it close to the thermal expansion coefficient of the semiconductor chip CHP1), a core layer CRL containing a glass cloth, which is a woven cloth made of glass fibers, is provided to reduce the thermal expansion coefficient of the buildup wiring board BPWB. It becomes however difficult to form a microvia VA when the buildup wiring board BPWB is comprised only of the core layer CRL containing a glass cloth. It is therefore the common practice to provide buildup layers BPL1 and BPL2 so as to sandwich the core layer CRL therebetween and form a microvia VA without incorporating the glass cloth in the buildup layers BPL1 and BPL2. In short, since the buildup layers BPL1 and BPL2 are free from the glass cloth, a microvia VA can be formed. The buildup layer BPL1 (BPL2) is however required to have a small thermal expansion coefficient so that a glass filler (glass in the form of particles or beads) is added thereto instead of the glass cloth.

As described above, the core layer CRL contains a glass cloth, while the buildup layer BPL1 (BPL2) contains a glass filler instead of the glass cloth. The thermal expansion coefficient of the buildup layer BPL1 (BPL2) containing a glass filler does not become as small as the thermal expansion coefficient of the core layer CRL containing a glass cloth. For example, the thermal expansion coefficient of the core layer is from about 17 to 20 ppm and the thermal expansion coefficient of the buildup layer is from about 40 to 60 ppm. As a result, there appears a difference in the thermal expansion coefficient between the buildup layer BPL1 (BPL2) and the core layer CRL and a thermal stress due to a difference in the thermal expansion coefficient is inevitably applied between the buildup layer BPL1 (BPL2) and the core layer CRL. The present inventors have found that this thermal stress tends to electrically disconnect the microvia VA formed in the buildup layer BPL1 (BPL2) and the semiconductor device thus obtained may presumably have deteriorated reliability.

In the second related technology, a measure for improving the reliability of a semiconductor device has been devised. The semiconductor device according to the second related technology obtained using this measure will next be described.

<Constitution of Semiconductor Device According to Second Related Technology>

Figure 4:
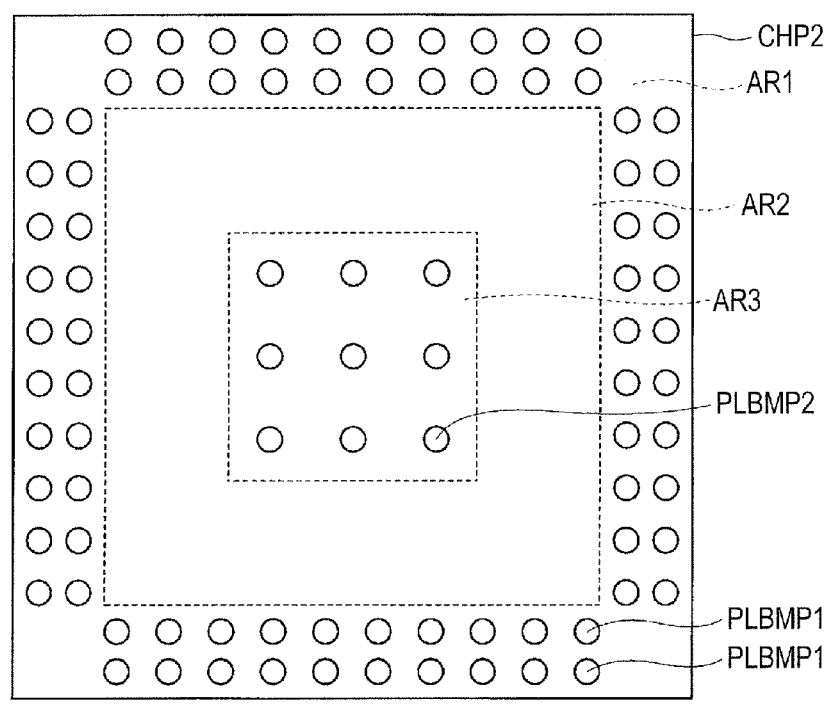
FIG. 4 shows the surface structure of a semiconductor chip according to a second related technology.

FIG. 4 shows the surface structure of a semiconductor chip CHP2 according to the second related technology. As shown in FIG. 4, the semiconductor chip CHP2 according to the second related technology is rectangular and has, in a surface area of the semiconductor chip CHP2, a pillared bump electrode (pillared protruding electrode) PLBMP1 and a pillared bump electrode PLBMP2. These pillared bump electrode PLBMP1 and pillared bump electrode PLBMP2 are comprised of, for example, a pillar portion made of copper (Cu) and a coupling portion formed on this pillar portion and made of a solder. The pillar portion has a height of, for example, about 30 μm and the coupling portion has a height (solder height) of about 15 μm. The pillar portion is cylindrical or cuboidal and in a plan view, the cylindrical one has a diameter of from about 30 to 35 μm and the cuboidal one has from about 30 to 35 μm on a side.

Described specifically, in the semiconductor chip CHP2 according to the second related technology, when the surface are of the semiconductor chip CHP2 is divided into an area AR1, an area AR2 which is present inside the area AR1, and an area AR3 which is present inside the area AR2, a plurality of pillared bump electrodes PLBMP1 are formed in the area AR1 and a plurality of pillared bump electrodes PLBMP2 are formed in the area AR3. This means that the pillared bump electrodes PLBMP1 and the pillared bump electrodes PLBMP2 are spaced apart with the area AR2 therebetween. Here, in the area AR1, two or more rows (two rows in FIG. 4) of pillared bump electrodes PLBMP1 are formed and in the area AR3, two or more pillared bump electrodes PLBMP2 are formed uniformly.

Here, the minimum pitch between the bumps of the pillared bump electrodes PLBMP1 placed in the area AR1 is smaller than the minimum pitch between the bumps of the pillared bump electrodes PLBMP2 placed in the area AR3. The minimum pitch between the bumps of the pillared bump electrodes PLBMP1 placed in the area AR1 is from about 40 to 60 μm. Even if the minimum pitch between the bumps of the pillared bump electrodes PLBMP1 is equal to or greater than the minimum pitch between the bumps of the pillared bump electrodes PLBMP2, however, no particular problem occurs.

On the other hand, the area AR2 has therein neither pillared bump electrode PLBMP1 nor pillared bump electrode PLBMP.

This means that the semiconductor chip CHP2 in the second related technology is characterized by that the pillared bump electrodes PLBMP1 (PLBMP2) are not formed throughout the surface of the semiconductor chip CHP2 but the pillared bump electrodes PLBMP1 (PLBMP2) are formed only in the area AR1 and the area AR3 and no pillared bump electrode PLBMP1 (PLBMP2) is formed in the area AR2. For example, the semiconductor chip CHP1 of the first related technology investigated by the present inventors and shown in FIG. 1, has bump electrodes BMP throughout the surface of the semiconductor chip CHP1. On the other hand, in the semiconductor chip CHP2 of the second related technology shown in FIG. 4, the pillared bump electrodes PLBMP1 (PLBMP2) are formed only in the area AR1 and area AR3 and no pillared bump electrode PLBMP1 (PLBMP2) is formed in the area AR2.

Figure 5:
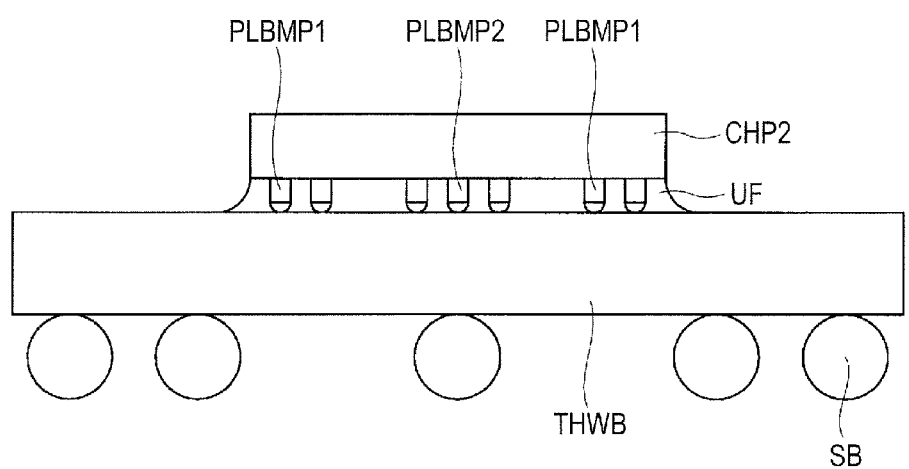
FIG. 5 is a side view showing the configuration of the semiconductor device according to the second related technology.

Next, the configuration of the semiconductor device according to the second related technology will be described. FIG. 5 is a side view showing the configuration of the semiconductor device according to the second related technology. As shown in FIG. 5, the semiconductor device according to the second technology has a through-hole wiring board THWB and this through-hole wiring board THWB has, on the back surface (lower surface) thereof, a plurality of solder balls SB. On the other hand, the through-hole wiring board THWB has, on the surface (upper surface) thereof, a semiconductor chip CHP2. Here, the semiconductor chip CHP2 is placed on the through-hole wiring board THWB so that a plurality of pillared bump electrodes PLBMP1 and a plurality of pillared bump electrodes PLBMP2 formed on the semiconductor chip CHP2 are electrically coupled to terminals (not illustrated) formed on the surface of the through-hole wiring board THWB. A space formed between the semiconductor chip CHP2 and the through-hole wiring board THWB is filled with an underfill UF, which is a sealing resin. As this underfill UF, an epoxy resin is often used and the underfill is used for ensuring coupling reliability between the semiconductor chip CHP2 and the through-hole wiring board THWB. In the semiconductor device according to the second related technology, a portion of the back surface of the semiconductor chip CHP2 which is opposite to the lower surface (bump electrode formation surface) of the semiconductor chip and a portion of the surface (main surface, upper surface) of the through-hole wiring board THWB are not covered with the underfill UF which is a sealing resin.

Next, the semiconductor device according to the second related technology having such a configuration, in particular, the internal structure of the through-hole wiring board THWB will be described more specifically.

Figure 6:
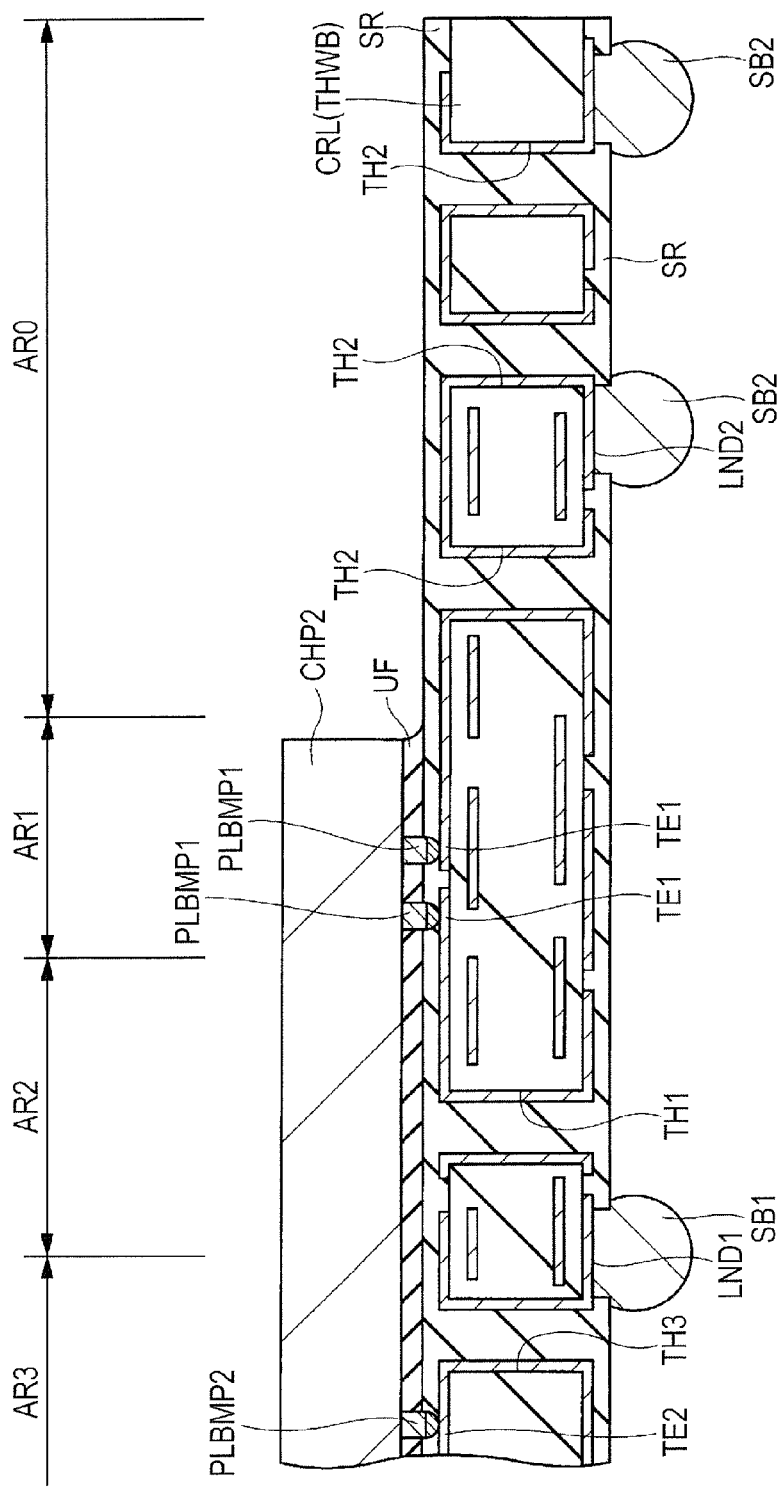
FIG. 6 shows a portion of the semiconductor device according to the second related technology and also shows an internal structure of a through-hole wiring board.

FIG. 6 shows a portion of the semiconductor device according to the second related technology and shows an internal structure of the through-hole wiring board THWB. As shown in FIG. 6, in the second related technology, the through-hole wiring board THWB is formed of a core layer CRL containing a glass cloth. This through-hole wiring board THWB has therein through-holes TH1, TH2, and TH3 penetrating from the surface (upper surface) to the back surface (lower surface) of the through-hole wiring board THWB. The through-hole wiring board THWB has, on the surface thereof, a solder resist SR (first solder resist) and this solder resist SR fills the through-holes TH1, TH2, and TH3 therewith. The solder resist SR has therein an opening portion and from this opening portion, a plurality of terminals TE1 or a plurality of terminals TE2 is exposed.

For example, the through-hole wiring board THWB has, on the surface thereof, a plurality of terminals TE1 and some of the terminals TE1 are electrically coupled to the through-hole TH1 on the surface of the through-hole wiring board THWB and the other terminals TE1 are electrically coupled to the through-hole TH2 on the surface of the through-hole wiring board THWB. In addition, the through-hole wiring board THWB has, on the surface thereof, a plurality of terminals TE2 and these terminals TE2 are electrically coupled to the through-hole TH3 on the surface of the through-hole wiring board THWB. At this time, the through-hole wiring board THWB has, on the surface thereof, the semiconductor chip CHP2 and the pillared bump electrode PLBM P1 formed on this semiconductor chip CHP2 and the terminals TE1 formed on the surface of the through-hole wiring board THWB are electrically coupled to each other. Similarly, the pillared bump electrode PLBMP2 formed on the semiconductor chip CHP2 and the terminal TE2 formed on the surface of the through-hole wiring board THWB are electrically coupled to each other. This means that the through-hole wiring board THWB has, on the surface and back surface of the core layer CRL, only one wiring layer. In other words, in the semiconductor device according to the second technology, the pillared bump electrode is directly and electrically coupled to the wiring layer of the device.

On the other hand, the through-hole wiring board THWB has, on the back surface thereof, a solder resist SR (second solder resist). The solder resist SR has therein an opening portion and from this opening portion, a plurality of lands LND1 (back-surface terminals) or a plurality of lands LND2. These lands LND1 are electrically coupled to the through-holes TH1 and TH3 on the back surface of the through-hole wiring board THWB, while the lands LND2 are electrically coupled to the through-hole TH2 on the back surface of the through-hole wiring board THWB. The lands LND1 have thereon a solder ball SB1 and the lands LND2 have thereon a solder ball SB2. More specifically, in the through-hole wiring board THWB according to the second related technology, the thickness of the wiring board (in consideration of the wiring thickness on the surface and back surface) attributable to the core layer CRL (about 0.4 mm) is about 0.5 mm and the through-hole diameter is about 150 μm.

The second related technology is characterized by the formation position of the through-holes TH1, TH2, and TH3 in the through-hole wiring board THWB or the formation position of the terminals TE1 or terminals TE2 formed on the surface of the through-hole wiring board THWB so that their configuration will next be outlined.

First, as shown in FIG. 6, the through-hole wiring board THWB has thereon the semiconductor chip CHP2 and it is divided into the following areas. As shown in FIG. 6, in an area on the through-hole wiring board THWB, an outer area having thereon no semiconductor chip CHP2 is defined as an area AR0. The area on the semiconductor chip CHP2 is divided into an area AR1 on the semiconductor chip CHP2, an area AR2 on the semiconductor chip CHP2, and an area AR3 on the semiconductor chip CHP2 corresponding to the area division shown in FIG. 4. Thus, the surface area of the through-hole wiring board THWB can be divided into the above-mentioned four areas.

Here, the area AR0 will be described. In the through-hole wiring board THWB, the area AR0 has therein a plurality of through-holes TH2. This means that the area AR0 of the surface area of the through-hole wiring board THWB has a plurality of through-holes TH2 in this area but has neither terminals TE1 nor terminals TE2. In particular, although the through-holes TH2 are electrically coupled to the terminals TE1, these terminals TE1 are not formed in the area AR0 having therein the through-holes TH2.

Next, the area AR1 will be described. In the through-hole wiring board THWB, the area AR1 has therein a plurality of terminals TE1. This means that the area AR1 of the surface area of the through-hole wiring board THWB has therein a plurality of terminals TE1 but has none of the through-holes TH1, TH2, and TH3. In particular, some of the terminals TE1 of the plurality of terminals TE1 are electrically coupled to the through-hole TH1, while the other terminals TE1 of the plurality of terminals TE1 are electrically coupled to the through-hole TH2. The area AR1 having therein the terminals TE1 has neither the through-hole TH1 nor the through-hole TH2. The area AR1 of the semiconductor chip CHP2 has therein a plurality of pillared bump electrodes PLBMP1 and the pillared bump electrodes PLBMP1 formed in the area AR1 of the semiconductor chip CHP2 are directly coupled to the terminals TE1 formed in the area AR1 of the through-hole wiring board THWB.

An area of the back surface of the through-hole wiring board THWB overlapping with the area AR1 in a plan view has therein none of the lands LND1 and LND2 and the solder balls SB1 and SB2 to be mounted on the lands LND1 and LND2. In other words, in a plan view, the lands LND1 and LND2 are placed so as not to overlap with the area AR1.

Next, the area AR2 will be described. The area AR2 of the through-hole wiring board THWB has therein a plurality of through-holes TH1. This means that the area AR2 of the surface area of the through-hole wiring board THWB has therein a plurality of through-holes TH1 but has neither the terminals TE1 nor the terminals TE2. In particular, the through-holes TH1 are electrically coupled to the terminals TE1, but these terminals TE1 are not formed in the area AR2 having therein the through-holes TH1. The area AR2 of the semiconductor chip CHP2 has therein neither a plurality of pillared bump electrodes PLBMP1 nor pillared bump electrode PLBMP2.

The area AR3 will next be described. The area AR3 of the through-hole wiring board THWB has therein a plurality of through-holes TH3 and a plurality of terminals TE2. This means that the area AR3 of the surface area of the through-hole wiring board THWB has therein both a plurality of through-holes TH3 and a plurality of terminals TE2. In particular, the through-holes TH3 are electrically coupled to the terminals TE2 and these terminals TE2 are formed in the area AR3 having therein the through-holes TH3. The area AR3 of the semiconductor chip CHP2 has therein a plurality of pillared bump electrodes PLBMP2 and the pillared bump electrodes PLBMP formed in the area AR3 of the semiconductor chip CHP2 are directly coupled to the terminals TE2 formed in the area AR3 of the through-hole wiring board THWB.

The through-hole wiring board THWB according to the second related technology has the configuration as described above. A further description will be made using a plan view in order to clarify the positional relationship of the through-holes TH1, TH2, and TH3 and the terminals TE1 and TE2.

Figure 7:
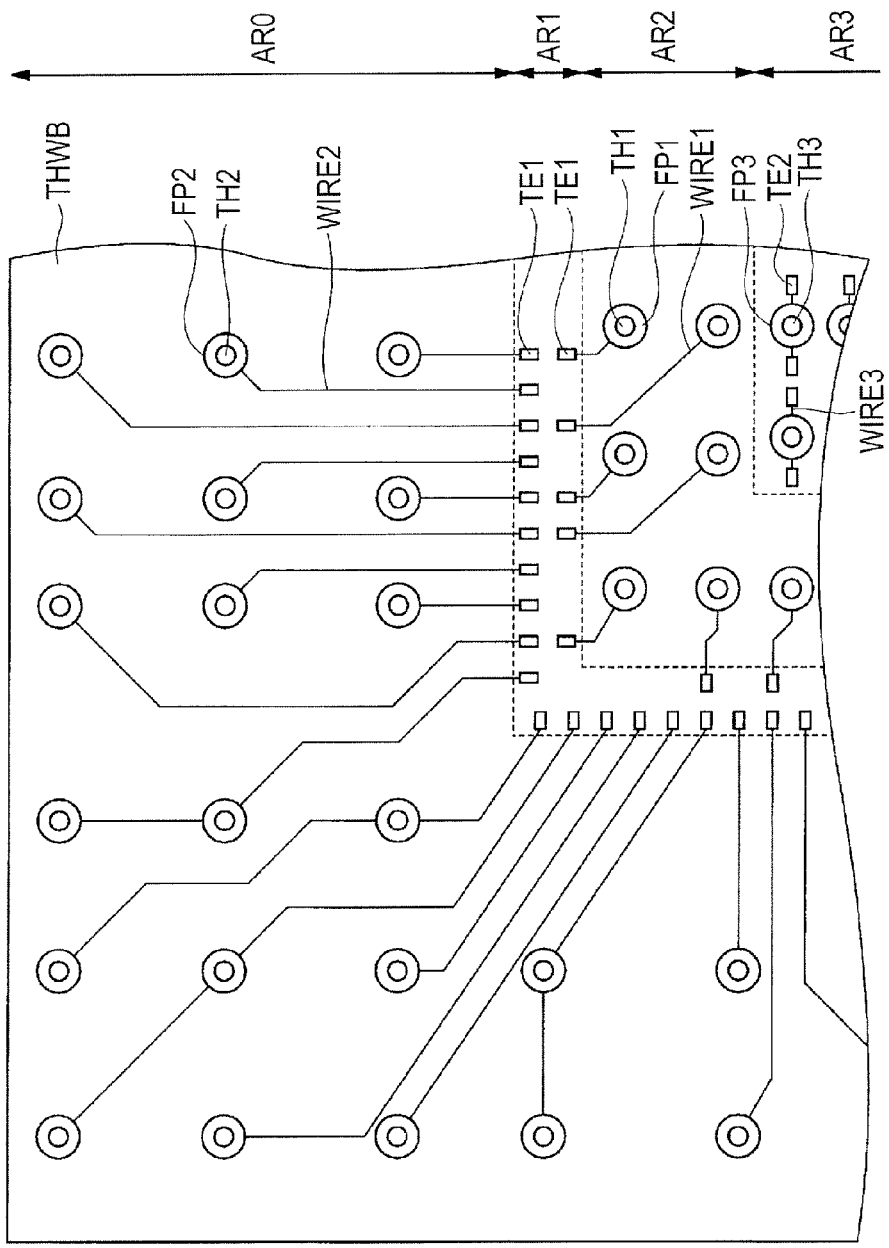
FIG. 7 is a plan view showing the partial configuration of the through-hole wiring board according to the second related technology.

FIG. 7 is a plan view showing a partial configuration of the through-hole wiring board THWB according to the second related technology. FIG. 7 shows roughly the one fourth of the whole area of the through-hole wiring board THWB. In addition, FIG. 7 shows the area AR0, area AR1, area AR2, and area AR3.

It is apparent from FIGS. 6 and 7 that the area AR0 is an area located outside the outer circumference of the semiconductor chip CHP2 in a plan view. In other words, the area AR0 is an area not overlapping with the semiconductor chip CHP2 in a plan view. Moreover, the area AR1, area AR2, and area AR3 are each an area located inside the outer circumference of the semiconductor chip CHP2 in a plan view. In other words, the area AR1, area AR2, and the area AR3 are areas overlapping with the semiconductor chip CHP2 in a plan view.

In FIG. 7, the area AR1 has therein a plurality of terminals TE1. More specifically, the area AR1 has therein a plurality of terminals TE1 in two rows. For example, the number of the terminals TE1 placed in a row near the outside is greater than that of the terminals TE1 placed in a row near the inside. The terminals TE1 placed in the row near the outside are electrically coupled to the through-holes TH2 formed in the area AR0. More specifically, the area RO has therein a plurality of through-holes TH2 and foot patterns FP2 are formed so as to be brought into contact with these through-holes TH2. These foot patterns FP2 and the terminals TE1 placed in a row near the outside are coupled to each other with a wiring WIRE2.

On the other hand, the terminals TE1 placed in a row near the inside are electrically coupled to the through-holes TH1 formed in the area AR2. More specifically, the area AR2 has therein a plurality of through-holes TH1 and foot patterns FP1 are formed so as to be brought into contact with these through-holes TH1. These foot patterns FP1 and the terminals TE1 placed in a row near the inside are coupled to each other with a wiring WIRE1.

Next, the area AR3 has therein a plurality of through-holes TH3 and a plurality of terminals TE2. The terminals TE2 formed in the area AR3 are electrically coupled to the through-holes TH3 formed also in the area AR3. More specifically, the area AR3 has therein a plurality of through holes TH3 and foot patterns FP3 are formed so as to be brought into contact with the through-holes TH3. These foot patterns FP3 and the terminals TE2 are coupled to each other with a wiring WIRE3. This means that the terminals TE1 and the terminals TE2 are spaced apart with the area AR2 therebetween.

<Characteristics of Semiconductor Device According to Second Related Technology>

The semiconductor device according to the second related technology has the above-mentioned configuration. Characteristics of it will hereinafter be described in detail. First characteristic of the second related technology is, for example, as shown in FIG. 6, use of a through-hole wiring board THWB as a wiring board on which the semiconductor chip CHP2 is to be mounted. This means that in the second related technology, the through-hole wiring board THWB as shown in FIG. 6 is used without using the buildup wiring board BPWB as shown in FIG. 3.

For example, in the buildup wiring board BPWB as shown in FIG. 3, due to a difference in material between the core layer CRL containing a glass cloth and the buildup layer BPL1 (BPL2) containing a glass filler instead of the glass cloth, there exists a difference in thermal expansion coefficient ($\alpha$) between the core layer CRL and the buildup layer BPL1 (BPL2). When the semiconductor chip CHP1 is heated and a thermal load is applied to the buildup wiring board BPWB, a microvia VA formed in the buildup layer BPL1 (BPL2) is exposed to a thermal stress due to a difference in thermal expansion coefficient between the core layer CRL and the buildup layer BPL1 (BPL2) and electric disconnection of the microvia VA tends to occur. As a result, the resulting semiconductor device inevitably has deteriorated reliability.

In the second related technology, on the other hand, not the buildup wiring board BPWB but the through-hole wiring board THWB is used. This through-hole wiring board THWB is comprised only of a core layer CRL containing a glass cloth, for example, as shown in FIG. 6 and does not have the buildup layer BPL1 (BLP2). In the through-hole wiring board THWB, therefore, there does not occur electrical disconnection of a microvia formed in the buildup layer BPL1 (BPL2) which will otherwise occur due to a difference in thermal expansion coefficient between the core layer CRL and the buildup layer BPL1 (BPL2). In other words, since the through-hole wiring board THWB has therein no buildup layer BPL1 (BPL2) and therefore has no microvia formed in the buildup layer BPL1 (BPL2), it is possible to avoid a problem such as electrical disconnection of a microvia. Thus, in the second related technology, a through-hole wiring board THWP comprised only of a core layer CRL is used so that it is unnecessary to consider a difference in thermal expansion coefficient between the buildup layer BPL1 (BPL2) and the core layer CRL and in addition, due to absence of the buildup layer BPL1 (BPL2), it is unnecessary to consider electrical disconnection of a microvia VA formed in the buildup layer BPL1 (BPL2). According to the second related technology, as a result, a semiconductor device having improved reliability can be obtained.

Moreover, the buildup wiring board BPWB has therein the buildup layer BPL1 (BPL2) with a large thermal expansion coefficient so that a large thermal stress tends to be applied to a sealing resin (underfill UF) for sealing the space between the buildup wiring board BPWB and the semiconductor chip CHP1. There is a high possibility of cracks appearing in the sealing resin.

In the second related technology, on the other hand, used is a through-hole wiring board (THWB) which has therein no buildup layer BPL1 (BPL2) with a large thermal expansion coefficient but is comprised only of a core layer CRL with a small thermal expansion coefficient. Not so large thermal stress is applied to a sealing resin (underfill UF) for sealing the space between the through-hole wiring board THWB and the semiconductor chip CHP2 compared with the case where the buildup wiring board BPWB is used. It is therefore possible to reduce the possibility of causing cracks in the sealing resin. Also from this standpoint, a semiconductor device having improved reliability can be provided according to the second related technology.

Thus, an advantage of using the through-hole wiring board THWB has been described, but the through-hole wiring board THWB has a disadvantage as well as the above-mentioned advantage. This disadvantage will hereinafter be described and a measure for overcoming this disadvantage of the through-hole wiring board THWB taken in the second related technology will also be described.

First, in the buildup wiring board BPWB, for example, as shown in FIG. 3, a microvia VA is filled with a conductor film so that a terminal TE can be formed on the microvia VA. In the buildup wiring board BPWB, a terminal TE can be placed even on the microvia VA and thus, limitations on the formation of wirings are not so many. This facilitates formation of fine-pitch wiring.

On the other hand, the through-hole wiring board THWB is, for example, as shown in FIG. 6, comprised only of a core layer CRL and through-holes TH1, TH2, and TH3 penetrating through this core layer CRL. In other words, the through-hole wiring board THWB according to the second related technology has therein through-holes TH1, TH2, and TH3 which penetrate from the surface to the back surface but there is a limitation that neither terminal TE1 nor terminal TE2 can be placed on these through-holes TH1, TH2, and TH3. The following is the reason of it.

The diameter of the through-holes TH1, TH2, and TH3 formed in the through-hole wiring board THWB is, for example, about 150 µm, greater than the diameter (about 50 µm) of a microvia. Even if a plating film (conductor film) is formed in the through-holes TH1, TH2, and TH3, the plating film is formed only on the inside wall and the through-holes TH1, TH2, and TH3 inevitably have a hollow inside without being filled with the plating film.

Figure 8:
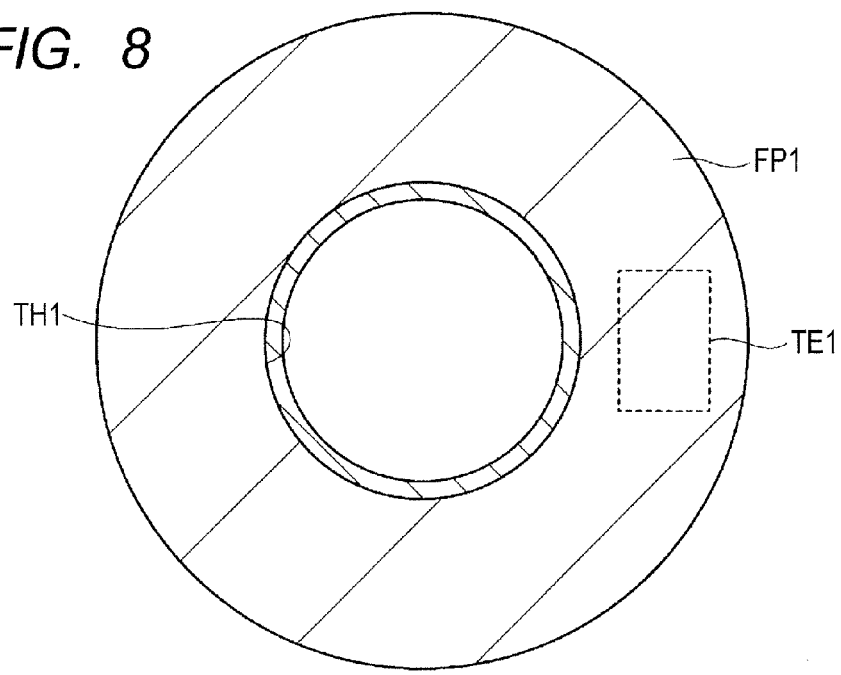
FIG. 8 shows a configuration example of placing a terminal on a through-hole.

With the through-hole TH1 as an example, among the through-holes TH1, TH2, and TH3 having such a configuration, a description will next be made on the placement of the terminal TE1 on the through-hole TH1. FIG. 8 shows a configuration example of placing a terminal TE1 on a through-hole TH1. As shown in FIG. 8, a foot pattern FP1 is formed so as to surround the upper surface of a hollow-state through hole TH1. The foot pattern FP1 has a diameter of about 250 μm. Since the through-hole TH1 is hollow, the plating film formed on the side surface of the through-hole TH1 and the foot pattern FP1 are electrically coupled by forming the foot pattern FP1 so as to surround the upper surface of the through-hole TH1. Formation of the terminal TE1 on this foot pattern FP1 is presumed to enable placement of the terminal TE1 on the through-hole TH1 via the foot pattern FP1.

Figure 9:
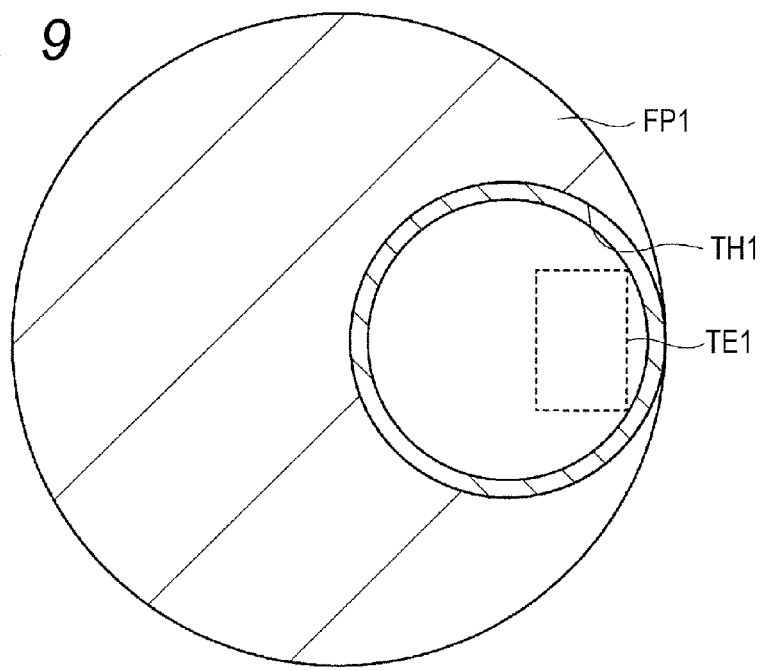
FIG. 9 shows a configuration example when misalignment occurs between the through-hole and a land.

In practice, however, as shown in FIG. 9, misalignment between the foot pattern FP1 and the through-hole TH1 may occur due to poor patterning accuracy upon formation of the through-hole TH and the foot pattern FP1. In this case, the terminal TE1 is inevitably placed on the hollow-state through-hole TH1 without being placed on the foot pattern FP1. Then, the through-hole TH1 becomes hollow, which prevents electrical coupling between the terminal TE1 and the through-hole TH1. Since the through-hole TH1 formed in the through-hole wiring board THWB has a large diameter, the through-hole becomes hollow and at the same time, misalignment occurs between the through-hole TH1 and the foot pattern FP1 due to poor patterning accuracy. As a result, a coupling failure may presumably occur between the through-hole TH1 and the terminal TE1 when the terminal TE1 is placed on the through-hole TH1.

Here, as in the through-hole TH formed in the buildup wiring board BPWB shown in FIG. 3, filling of the through-hole TH with a hole filling resin can be considered in order to overcome the above problem. This means that in the buildup wiring board BPWB, the through-hole TH with a large diameter is filled with a hole filling resin. Then, a lid plating film is formed on the through-hole TH filled with the hole filling resin, followed by the formation of a via VA or wiring on this lid plating film. In the buildup wiring board BPWB, a via or wiring is placed even on the through-hole TH with a large diameter so that the restrictions in wiring can be reduced.

In the through-hole wiring board THWB (refer to FIG. 6) according to the second related technology, different from the buildup wiring board BPWB shown above in FIG. 3, the through-hole TH with a large diameter is not filled with a hole filling resin, because the cost of the hole filling resin itself and labor for filling the through-hole TH with the hole filling resin inevitably lead to an increased manufacturing cost. In the through-hole wiring board THWB, therefore the through-holes TH1, TH2, and TH3 are filled with a solder resist SR applied to the surface and back surface of the wiring board. In other words, a solder resist SR (first solder resist) applied to the surface of the through-hole wiring board THWB and a solder resist SR (second solder resist) applied to the back surface of the through-hole wiring board THWB are coupled to each other with solder resists SR with which the through-holes (TH1, TH2, and TH3) are filled.

It is to be noted that the solder resist SR (first solder resist) formed on the surface of the through-hole wiring board THWB, the solder resist SR (second solder resist) formed on the back surface of the through-hole wiring board THWB, and the solder resists SR with which the through-holes (TH1, TH2, and TH3) are filled are all comprised of the same material. This is one of the differences in structure between the through-hole wiring board THWB and the buildup wiring board BPWB.

Even in the through-hole wiring board THWB according to the second related technology, by filling the through-hole TH1 with a hole filling resin and forming a lid plating film, it is possible to electrically couple the through-hole TH1 and the terminal TE1 surely even when the terminal TE1 is formed on the through-hole TH1. Such a configuration is however not employed in the through-hole wiring board THWB according to the second related technology because the configuration inevitably increases the cost of the through-hole wiring board THWB. In the through-hole wiring board THWB according to the second related technology, therefore, there appears a problem that the terminal TE1 cannot be placed on the through-hole TH1.

On the assumption that the terminal TE1 cannot be placed on the through-hole TH1, however, the second related technology takes a measure to form a wiring layout on the through-hole wiring board THWB as efficiently as possible and at the same time, suppress a cost increase. This measure is a second characteristic of the second related technology. This second characteristic will hereinafter be described referring to some drawings.

The second characteristic of the second related technology is, as shown for example in FIG. 6, a wiring layout is devised while separating a through-hole TH1 formation area, a through-hole TH2 formation area, and a terminal TE1 formation area from each other. More specifically, as shown in FIG. 6, a plurality of through-holes TH2 is provided in the area AR0 of the through-hole wiring board THWB and a plurality of terminals TE1 is provided in the area AR1 of the through-hole wiring board THWB. In addition, a plurality of through-holes TH1 is provided in the area AR2 of the through-hole wiring board THWB. Such a configuration enables formation of the through-holes TH1 and TH2 and the terminals TE1 in/on the through-hole TH1 and the through-hole TH2 without placing the terminal TE1 on the through-hole TH1 and the through-hole TH2.

Moreover, the wiring layout thus devised will be described referring to FIG. 7. In FIG. 7, the terminals TE1 are formed in two rows in the area AR1 of the through-hole wiring board THWB. A plurality of through-holes TH2 is placed in the area AR0 which is an area outside the area AR1. In the area AR2 which is an area inside the area AR1, on the other hand, a plurality of through-holes TH1 is placed. At this time, the terminals TE1 in the row placed near the outside, between the two rows of terminals TE1 formed in the area AR1, are electrically coupled to the through-holes TH2 placed in the area AR0, while the terminals TE1 in the row placed close to the inside, between the two rows of terminals TE1 formed in the area AR1, are electrically coupled to the through-holes TH1 placed in the area AR2. Thus, in the second related technology, the terminals TE1 to be electrically coupled to the through-holes TH2 formed in the area AR0 are placed on the side near the area AR0 and the terminals TE1 to be electrically coupled to the through-holes TH1 formed in the area AR2 are placed on the side near the area AR2. Such a configuration makes it possible to realize coupling between the through-hole TH1 and the terminal TE1 and coupling between the through-hole TH2 and the terminal TE2 efficiently while separating the through-hole TH1 formation area, the through-hole TH2 formation area, and the terminal TE1 formation area from each other.

For example, there are cases where the through-holes TH2 formed in the area AR0 are coupled to the terminals TE1 placed in the row near the area AR2 or the through-holes TH1 formed in the area AR2 are coupled to the terminals TE1 placed in the row near the area AR0. In such a case, wirings formed in the area AR1 need complex dragging, making it difficult to configure an efficient wiring layout.

In the second related technology, as shown in FIG. 7, the terminals TE1 to be electrically coupled to the through-holes TH2 formed in the area AR0 are placed on the side near the area AR0 and at the same time, the terminals TE1 to be electrically coupled to the through-holes TH1 formed in the area AR2 are placed on the side near the area AR2.

In other words, in the area AR1, the terminals TE1 electrically coupled to the through-holes TH2 are placed so as to be closer to the area AR0 than to the area AR2 and the terminals TE1 electrically coupled to the through-holes TH1 are placed so as to be closer to the area AR2 than to the area AR0. At this time, the terminals TE1 are electrically coupled to the through-holes TH1 and TH2 via wirings WIRE1 and WIRE2, respectively. This means that there are no wirings which cross the area AR1 to couple the area AR0 and the area AR2 or which run between terminals TE1.

By coupling wirings in such a manner, the second related technology makes it possible to omit the dragging of the wirings in the area AR1 and efficiently couple the through-holes TH1 to the terminals TE1 and efficiently couple the through-holes TH2 to the terminals TE1 while separating the through-hole TH1 formation area, the through-hole TH2 formation area, and the terminal TE1 formation area from each other. The through-hole wiring board THWB has only one wiring layer on each of the surface and back surface of the core layer CRL so that high-density wiring cannot be conducted in this structure compared with a structure in which a plurality of buildup layers (a plurality of layers as BPL1 and a plurality of layers as BPL2) is provided on each of the surface and back surface of the core layer CRL of the buildup wiring board BPWB to form multilayer wiring. The above-described characteristic dragging manner is therefore important in realizing high density wiring in the through-hole wiring board THWB comparable to that in the buildup wiring board BPWB.

Another characteristic of the second related technology is that as shown in FIG. 7, the through-holes TH1 and the through-holes TH2 are formed in not one area but in both the area AR0 which is an area outside the area A1 having therein the terminals TE1 and the area AR2 which is an area inside the area A1. Supposing that through-holes TH2 are formed only in the area AR0 which is an area outside the area AR1 having therein the terminals TE1, the number of through-holes TH2 formed in the area AR0 increases because the through-holes TH2 are formed only in the area AR0. This increases the number of wirings for electrically coupling a plurality of through-holes TH2 formed in the area AR0 and a plurality of terminals TE1 formed in the area AR1, respectively. This requires fine-pitch wiring to be laid from the area AR0 to the area AR1.

In the second related technology, however, not a buildup wiring board suited for fine-pitch wiring but a through-hole wiring board THWB less suited for fine-pitch wiring than the buildup wiring board is used. This reveals that it is difficult to realize, in the through-hole wiring board THWB, the layout configuration in which through-holes TH2 are placed densely only in the area AR0 as described above.

In the second related technology, therefore, there is devised a measure of not placing the through-holes TH2 densely in the area AR0 but placing the through-holes TH1 and TH2 in the area AR0 and area AR2, respectively, while sandwiching therebetween the area AR1 having therein the terminals TE1. This makes it possible to distribute the through-holes TH1 and the through-holes TH2 in the area AR0 and the area AR2 and therefore to disperse the wirings WIRE1 for coupling the through-holes TH1 and the terminals TE1 and the wirings WIRE2 for coupling the through-holes TH2 and the terminals TE1 in different areas without increasing their density. As a result, even if the through-hole wiring board THWB not suited for fine-pitch wiring is used, it is possible to respond to an increase in the number of the through-holes TH1 (TH2) and terminals TE1 to satisfy a demand for semiconductor devices having a higher function. It has been found also from this standpoint that an efficient wiring layout is realized according to the second related technology.

As shown in FIG. 7, the area of the area AR0 is larger than that of the area AR2 so that the number of the through-holes TH2 formed in the area AR0 is larger than that of the through-holes TH1 formed in the area AR2. Accordingly, the number of the terminals TE1 to be electrically coupled to the through-holes TH2 formed in the area AR0 is larger than that of the terminals TE1 to be electrically coupled to the through-holes TH1 formed in the area AR2. This suggests that the number of the terminals TE1 placed on the side near the area AR0, among those formed in two rows in the area AR1, is larger than that of the terminals TE1 placed on the side near the area AR2. Wirings for coupling the through-holes TH2 formed in the area AR0 and the terminals TE1 formed in the area AR1 include, for example, a power supply line for supplying a power supply potential, a GND line for supplying a reference potential (GND potential), or a signal line for transferring a signal (signal voltage). Similarly, wirings for coupling the through-holes TH1 formed in the area AR2 and the terminals TE1 formed in the area AR1 include, for example, a power supply line for supplying a power supply potential, a GND line for supplying a reference potential (GND potential), or a signal line for transferring a signal (signal voltage).

The third characteristic of the second related technology is that as shown in FIG. 6, a plurality of through-holes TH3 and a plurality of terminals TE2 are formed in the area AR3. Described specifically, the principal technical concept of the second related technology is, as described above in the description on the second characteristic, that the through-holes TH1 and the terminals TE1 are efficiently coupled to each other and the through-holes TH2 and the terminals TE1 are efficiently coupled to each other while separating the through-hole TH1 formation area, the through-hole TH2 formation area, and the terminal TE1 formation area to each other. The second related technology however has a characteristic, as a third one, that a plurality of through-holes TH3 and a plurality of terminals TE2 are formed in the area AR3.

More specifically, as shown in FIG. 7, the area AR3 has therein a plurality of through-holes TH3 and a plurality of terminals TE2, but no terminals TE2 are placed on the through-holes TH3. This means that as shown in FIG. 7, foot patterns FP3 are formed so as to surround the upper portion of the through-holes TH3, but these foot patterns FP3 have thereon no terminals TE2. The foot patterns FP3 and the terminals TE2 are coupled to each other with wirings WIRE3. The wirings WIRE3 formed in this area AR3 and coupling the through-holes TH3 to the terminals TE2 are comprised only of, for example, a power supply line for supplying a power supply potential and a GND line for supplying a reference potential (GND potential). This means that the wirings WIRE3 formed in the area AR3 and coupling the through-holes TH3 to the terminals TE2 do not include a signal line for transferring a signal (signal voltage).

According to the second related technology, therefore, not only a power supply potential and a reference potential can be supplied from some of the terminals TE1 formed in the area AR1 to the semiconductor chip CHP2 but also a power supply potential and a reference potential can be supplied from the terminals TE2 formed in the area AR3 to the semiconductor chip CHP2. This means that a power supply potential and a reference potential can be supplied through not only from the area AR1 of the semiconductor chip CHP2 but also from the area AR3 so that a power supply voltage drop (IR drop) in the semiconductor chip CHP2 can be reduced.

For example, when the through-holes TH3 and the terminals TE2 configuring a power supply wiring and a reference wiring are not formed in the area AR3, a power supply potential and a reference potential can be supplied to the inside of the semiconductor chip CHP2 only from the terminals TE1 formed in the area AR1. In this case, in order to supply a power supply potential and a reference potential to an integrated circuit formed in the area AR3 of the semiconductor chip CHP2, it is necessary to drag about an internal wiring of the semiconductor chip CHP2 from the area AR1 to the area AR3 of the semiconductor chip CHP2. A resistance component derived from dragging of the internal wiring however inevitably causes a drop in power supply potential (power supply voltage drop).

In the second related technology, through-holes TH3 and terminals TE2 which configure the power supply wiring and reference wiring are formed in the area AR3 of the through-hole wiring board THWB and from these terminals TE2, a power supply potential and a reference potential are supplied to the area AR3 of the semiconductor chip CHP2. The second related technology makes it possible not only to supply a power supply potential and a reference potential from some of the terminals TE1 formed in the area AR1 to the semiconductor chip CHP2 but also to supply the power supply potential and reference potential from the terminals TE2 formed in the area AR3 to the semiconductor chip CHP2. In short, since the power supply potential and the reference potential can be supplied not only through the area AR1 of the semiconductor chip CHP2 but also through the area A3, a power supply voltage drop (IR drop) in the semiconductor chip CHP2 can be reduced.

The power supply potential and the reference potential to be supplied from some of the terminals TE1 formed in the area AR1 can be supplied to an I/O circuit (external interface circuit) formed on the semiconductor chip CHP2. On the other hand, the power supply potential and the reference potential to be supplied from some of the terminals TE2 formed in the area AR3 can be supplied to a core circuit (internal circuit) formed on the semiconductor chip CHP2. This means that it is desired to supply a power supply potential and a reference potential to the I/O circuit from a plurality of terminals TE1 formed in the area AR1 and supply a power supply potential and a reference potential to the core circuit which is driven at a voltage lower than that of the I/O circuit from a plurality of terminals TE2 formed in the area AR3. In other words, the power supply potential supplied from a plurality of terminals TE1 formed in the area AR1 is higher than the power supply potential supplied from a plurality of terminals TE2 formed in the area AR3.

Since, for example, the pillared bump electrode PLBMP1 of the semiconductor chip CHP2 to which the terminal TE1 is coupled is a bump electrode including an input/output signal pin, when a power supply potential and a reference potential for the I/O circuit is supplied to the terminal TE1, the above-mentioned configuration makes it possible to supply the power supply potential and the reference potential for the I/O circuit efficiently with the shortest distance. On the other hand, since the pillared bump electrode PLBMP2 of the semiconductor chip CHP2 to which the terminal TE2 is coupled is a bump electrode not including an input/output signal pin, when a power potential and a reference potential for the core circuit for driving an internal circuit (core circuit) placed at the center portion of the semiconductor chip CHP2, the above-mentioned configuration makes it possible to supply the power supply potential and the reference potential for the core circuit efficiently with the shortest distance.

Moreover, in the second related technology, with regard to the through-holes TH3 placed in the area AR3 of the through-hole wiring board THWB, the through-holes TH3 for supplying a power supply potential and the through-holes TH3 for supplying a referential potential are preferably placed alternately. In this case, the power supply potential and the reference potential can be supplied uniformly throughout the area AR3 of the semiconductor chip CHP2.

More specifically, the semiconductor chip CH2 has, in the area AR3 at the center portion of the semiconductor chip, an internal circuit (core circuit) and it is possible to supply this core circuit with a power supply potential and a reference potential uniformly by alternately placing the through-holes TH3 for supplying a power supply potential and the through-holes TH3 for supplying a reference potential. Supposing that the through-holes T3 for supplying a power supply potential and the through-holes TH3 for supplying a reference potential are placed not uniformly, it will be difficult to uniformly supply the core circuit formed in the area AR3 with a power supply potential and a reference potential. By alternately placing the through-holes TH3 for supplying a power supply potential and the through-holes TH3 for supplying a reference potential, however, it is possible to uniformly supply the core circuit with a power supply potential and a reference potential. As a result, the core circuit has improved operation stability.

The through-hole wiring board THWB according to the second related technology therefore has the above-mentioned second characteristic and the third characteristic. As shown in FIG. 6, the terminals TE1 are formed in the area AR1 of the through-hole wiring board THWB and the terminals TE2 are formed in the area AR3 of the through-hole wiring board THWB. This means that according to the second related technology, all of the area AR1, the area AR2, and the area AR3 of the through-hole wiring board THWB on which the semiconductor chip CHP2 is mounted do not have terminals (terminal TE1 and TE2) so that the position of bump electrodes formed on the semiconductor chip CHP2 to be mounted on the through-hole wiring board THWB is also changed. More specifically, the configuration as shown in FIG. 1 in which bump electrodes BMP are formed throughout the surface of a rectangular semiconductor chip CHP1 is changed to the configuration as shown in FIG. 4 in which pillared bump electrodes PLBMP1 (PLBMP2) are formed only in the areas AR1 and AR3 of a rectangular semiconductor chip CHP2.

The characteristic of the semiconductor chip CHP2 to be mounted on the through-hole wiring board THWB according to the second related technology will next be described. The fourth characteristic of the second related technology resides in the bump structure of the semiconductor chip CHP2 to be mounted on the through-hole wiring board THWB. More specifically, as shown in FIG. 4, the semiconductor chip CHP2 according to the second related technology has an area AR1, an area AR2 inside this area AR1, and an area AR3 inside this area AR2. The area AR1 has therein a pillared bump electrode PLBMP1 and the area AR3 has therein a pillared bump electrode PLBMP2, while the area AR2 has therein neither a pillared bump electrode PLBMP1 nor a pillared bump electrode PLBMP2.

FIG. 6 shows the semiconductor chip CHP2 with such a configuration mounted on the through-hole wiring board THWB. It has been found from FIG. 6 that the pillared bump electrode PLBMP1 formed in the area AR1 of the semiconductor chip CHP2 is directly coupled to the terminal TE1 formed in the area AR1 of the through-hole wiring board THWB and the pillared bump electrode PLBMP2 formed in the area AR3 of the semiconductor chip CHP2 is directly coupled to the terminal TE2 formed in the area AR3 of the through-hole wiring board PLBMP2. In other words, a portion where the pillared bump electrode PLBMP1 is coupled to the terminal TE1 and a portion where the pillared bump electrode PLBMP2 is coupled to the terminal TE2 are placed separately with the area AR2 of the semiconductor chip CHP2 (through-hole wiring board THWB) therebetween.

Here, the problem which occurs in changing the bump structure from that of the semiconductor chip CHP1 shown in FIG. 1 to that of the semiconductor chip CHP2 shown in FIG. 4 will next be described. For example, the bump structure is changed from that of the semiconductor chip CHP1 shown in FIG. 1 to that of the semiconductor chip CHP2 shown in FIG. 4 without changing the number of bump electrodes formed on the semiconductor chip CHP2 shown in FIG. 1. In this case, the semiconductor chip CHP1 shown in FIG. 1 has bump electrodes BMP throughout the surface area thereof, while the semiconductor chip CHP2 shown in FIG. 4 has bump electrodes only in portions (area AR1 and area AR3) of the surface area thereof. This suggests that an area of the semiconductor chip CHP2 shown in FIG. 4 in which bump electrodes are placed becomes smaller than an area of the semiconductor chip CHP1 shown in FIG. 1 in which bump electrodes BMP are placed. In order to make equal the number of bump electrodes of the semiconductor chip CHP1 shown in FIG. 1 and the number of bump electrodes of the semiconductor chip CHP2 shown in FIG. 4, the size of bump electrodes of the semiconductor chip CHP2 shown in FIG. 4 must be made smaller than the size of bump electrodes BMP of the semiconductor chip CHP1 shown in FIG. 1.

The bump electrodes BMP formed on the semiconductor chip CHP1 shown in FIG. 1 are hemispherical bump electrodes BMP made of, for example, a solder. First, a decrease in the size of these bump electrodes BMP is considered.

Figure 10:
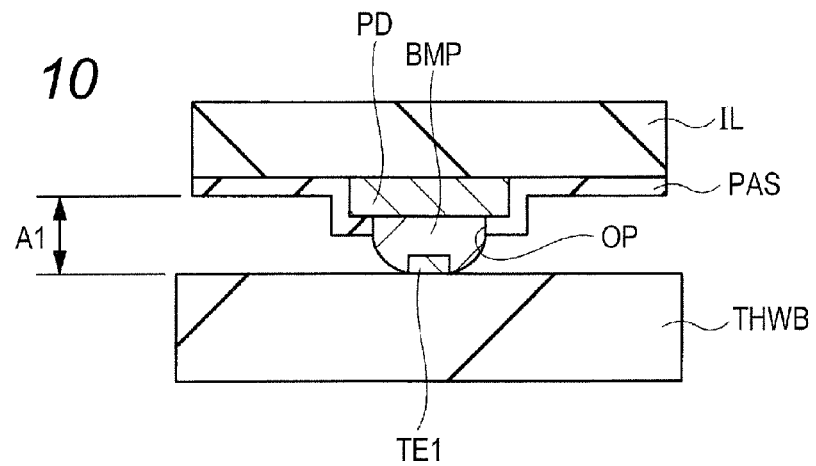
FIG. 10 is a cross-sectional view showing a hemispherical bump electrode made of a solder which has been mounted on the through-hole wiring board after size reduction.

FIG. 10 is a cross-sectional view of the hemispherical bump electrode BMP made of a solder mounted on the through-hole wiring board THWB after size reduction of this bump electrode BMP. As shown in FIG. 10, the through-hole wiring board THWB has thereon a terminal TE1 and the bump electrode BMP is mounted on this terminal TE1. This bump electrode BMP is formed in an opening portion OP formed in a passivation film (surface protecting film) PAS made of, for example, a silicon nitride film. This bump electrode BMP is formed on a pad PD exposed from the opening portion OP. The pad PD is formed on an interlayer insulating film IL.

If the size of this hemispherical bump electrode BMP is reduced, the space (standoff) A1 between the semiconductor chip and the through-hole wiring board THWB also becomes narrow. When the space (standoff) A1 between the semiconductor chip and the through-hole wiring board THWB is narrowed, the filling property of the underfill with which the space is filled is deteriorated and may form voids (air bubbles) in the underfill. When the voids are formed in the underfill, water penetrates into the voids and the water in the voids expands by high-temperature reflow (for example, from about 240 to 260° C.) during solder mounting on a mounting substrate. As a result, cracks may be caused in the underfill with the voids as a starting point. Moreover, if the voids exist adjacent to the bump electrode, water penetrated into the voids may cause corrosion at the coupled portion between the bump electrodes BMP and the terminals TE1 and deteriorate the coupling reliability between the semiconductor chip and the through-hole wiring board THWB. This means that only a reduction in the size of the hemispherical bump electrode BMP formed on the semiconductor chip CHP1 shown in FIG. 1 may lead to deterioration in the reliability of the semiconductor device because of the narrowing of the space (standoff) A1 between the semiconductor chip and the through-hole wiring board THWB.

Figure 11:
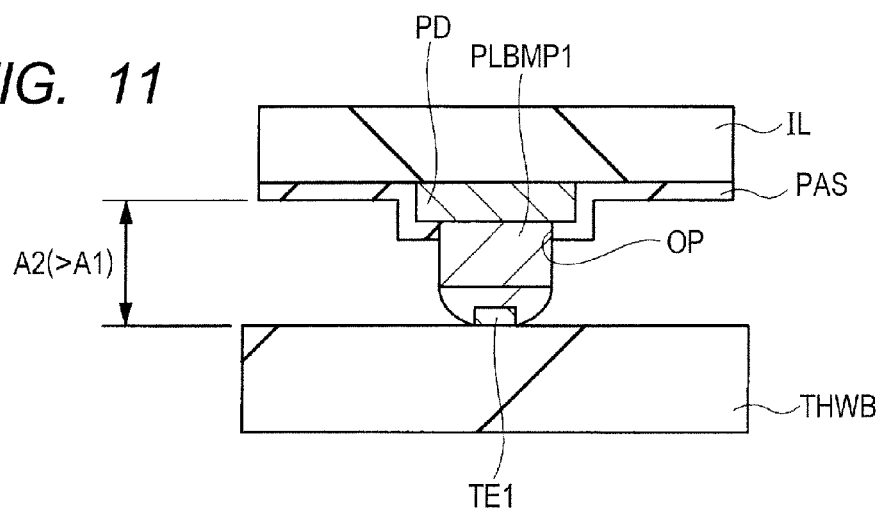
FIG. 11 is a partial cross-sectional view of a pillared bump electrode mounted on the through-hole wiring board.

As a result of investigation, the present inventors have found that the space (standoff) A1 between the semiconductor chip and the through-hole wiring board THWB should be about 20 μm or greater in order to secure the filling property of the underfill. The second related technology therefore employs not the hemispherical bump electrode BMP as shown in FIG. 10 but a pillared bump electrode PLBMP1 as shown in FIG. 11. FIG. 11 is a partial cross-sectional view of a pillared bump electrode PLBMP1 mounted on the through-hole wiring board THWB. As shown in FIG. 11, the through-hole wiring board THWB has thereon a terminal TE1 and the pillared bump electrode PLBMP1 is mounted on this terminal TE1. This pillared bump electrode BMP is comprised of a pillar portion made of, for example, copper (Cu) and a coupled portion formed on this pillar portion and made of a solder. In other words, the pillared bump electrode PLBMP1 has a first portion made of a solder and a second portion (copper) having a melting point higher than that of the first portion (solder). This pillared bump electrode PLBMP1 is formed in an opening portion OP formed in a passivation film (surface protecting film) PAS made of, for example, a silicon nitride film. This pillared bump electrode PLBMP1 is formed on a pad PD exposed from the opening portion OP. The pad PD is formed on an interlayer insulating film IL.

In the pillared bump electrode PLBMP1 having such a configuration, even if the size of the pillared bump electrode PLBMP1 is reduced, the pillar portion made of copper prevents the space (standoff) A2 between the semiconductor chip and the through-hole wiring board THWB from becoming smaller than the space (standoff) A1 at the time when the hemispherical bump electrode BMP as shown in FIG. 10 is used for coupling (A2>A1). Described specifically, the pillared bump electrode BMP has a first portion made of a solder and a second portion (copper) having a melting point higher than that of the first portion (solder). In this case, the semiconductor chip is mounted on the through-hole wiring board THWB and the pillared bump electrode PLBMP1 of the semiconductor chip and the terminal TE1 on the through-hole wiring board THWB are electrically coupled to each other by melting the first portion (solder) of the pillared bump electrode PLBMP1 at a high temperature (for example, from about 240 to 260° C.). During melting, the second portion (copper) of the pillared bump electrode PLBMP1 is not molten even at a high temperature because the melting point of the second portion is higher than that of the first portion (solder). Accordingly, the space (standoff) A2 between the semiconductor chip and the through-hole wiring board THWB does not become smaller than the height of the second portion (copper) of the pillared bump electrode PLBMP1. As described above, the space (standoff) A2 between the semiconductor chip and the through-hole wiring board THWB should be about 20 μm or greater in order to secure the filling property of the underfill, but the height of the second portion (copper) of the pillared bump electrode PLBMP1 is as high as about 30 μm so that it fully satisfies the requirement.

When the pillared bump electrode PLBMP1 as shown in FIG. 11 is used, a sufficient standoff can be secured even if the size of the pillared bump electrode PLBMP1 itself is reduced. This makes it possible to suppress deterioration in the filling property of the underfill or deterioration in the coupling reliability between the semiconductor chip and the through-hole wiring board THWB. The semiconductor chip CHP2 according to the second related technology uses, for example, the pillared bump electrode PLBMP1 and the pillared bump electrode PLBMP2 as shown in FIGS. 5 and 6.

In the above description, the second portion of the pillared bump electrode PLBMP1 made of copper is given as an example but any material is usable insofar as it is a (metal) material having a melting point higher than that of the solder of the first portion. As well as copper, gold (Au) or the like may be used as the material of the second portion. The cost (material cost) can be reduced by using copper as the second portion compared with using gold. The second portion of the pillared bump electrode PLBMP1 can be made higher easily by stacking copper by plating.

As the solder of the first portion of the pillared bump electrode PLBMP1, a Sn—Ag-based or Sn—Ag—Cu-based lead-free solder may be used.

The fourth characteristic of the second related technology is therefore that for example as shown in FIG. 4, the pillared bump electrode PLBMP1 (PLBMP2) is formed only in portions (area AR1 and area AR3) of the surface area of the semiconductor chip CHP2. This makes it possible to configure the semiconductor chip CHP2 suited for the through-hole wiring board THWB having the second and third characteristics. By mounting the semiconductor chip CHP2 having the fourth characteristic on the through-hole wiring board THWB having the second and third characteristics, a semiconductor device having improved reliability can be obtained at a reduced cost.

In the second related technology, an example of configuring the bump electrode to be formed on the semiconductor CHP2 from the pillared bump electrode PLBMP1 (PLBMP2) has been described, but the bump electrode to be formed on the semiconductor chip CHP2 is not limited to it but may be configured from a stud bump electrode.

Figure 12:
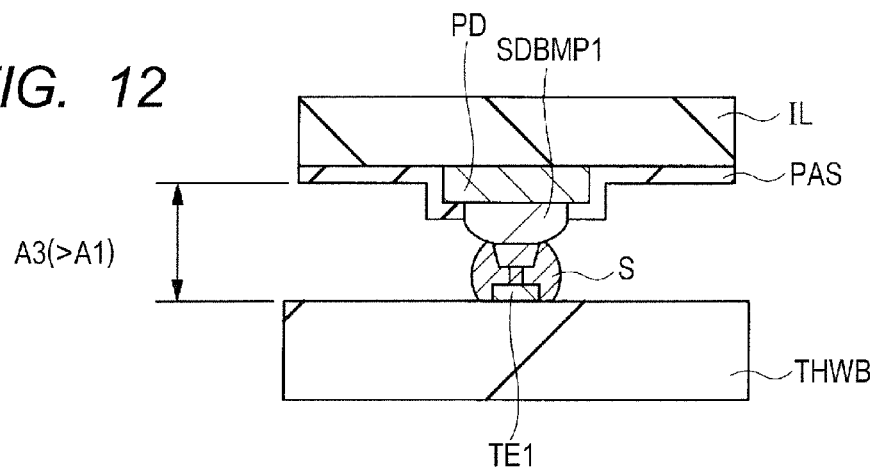
FIG. 12 is a cross-sectional view showing a stud bump electrode made of gold mounted on the through-hole wiring board.

FIG. 12 is a cross-sectional view showing a stud bump electrode SDBMP1 made of, for example, gold mounted on the through-hole wiring board THWB. As shown in FIG. 12, the through-hole wiring board THWB has thereon the terminal TH1 and the stud bump electrode SDBMP1 is mounted on this terminal TE1 and at the same time, a solder S is formed so as to cover the coupled portion between the terminal TE1 and the stud bump electrode SDBMP1. The stud bump electrode SDBMP1 is formed in an opening portion OP formed in a passivation film (surface protecting film) PAS made of, for example, a silicon nitride film and the stud bump electrode SDBMP1 is formed on a pad PD exposed from the opening portion OP. This pad is formed on an interlayer insulating film IL.

In the stud bump electrode SDBMP1 having such a configuration, even if the size of the stud bump electrode SDBMP1 is reduced, a space (standoff) A3 (>A1) between the semiconductor chip and the through-hole wiring board THWB can be secured. Also in this example, the stud bump electrode SDBMP1 (second portion) is made of a material having a melting point higher than that of the solder S (first portion). When the stud bump electrode SDBMP1 (second portion) is electrically coupled to the terminal TE1 on the through-hole wiring board THWB by melting at a high temperature, the stud bump electrode SDBMP1 (second portion) is not melted at a high temperature because the melting point of the stud bump electrode SDBMP1 (second portion) is higher than that of the solder S (first portion). The height of the space (standoff) A3 between the semiconductor chip and the through-hole wiring board THWB does not become smaller than the height of the stud bump electrode SDBMP1 (second portion, gold).

As a result, when the stud bump electrode SDBMP1 as shown in FIG. 12 is used, a sufficient standoff can be secured even if the size of the stud bump electrode SDBMP1 itself is reduced. This makes it possible to suppress deterioration in the filling property of the underfill or deterioration in the coupling reliability between the semiconductor chip and the through-hole wiring board THWB. Thus, the stud bump electrode SDBMP1 may be used instead of the pillared bump electrode PLBMP1 (PLBMP2).

Here, the description has been made using, as an example, the stud bump electrode SDBMP1 made of gold, but it may be, for example, a copper stud bump electrode formed by using a copper wire.

The semiconductor chip CHP2 according to the second related technology having the fourth characteristic as described above exhibits the following effect. Described specifically, in the semiconductor chip CHP2 according to the second related technology, for example as shown in FIG. 4, the area AR1 has therein the pillared bump electrode PLBMP1 and at the same time, the area AR3 sandwiching the area AR2 with the area AR1 has the pillared bump electrode PLBMP1. This means that the pillared bump electrode PLBMP1 formed in the area AR1 and the pillared bump electrode PLBMP2 formed in the area AR3 are separated from each other with a space corresponding to the area AR2 formed between the area AR1 and the area AR3.

Here, the pillared bump electrode PLBMP2 formed in the area AR3 is coupled to a power source line and has a function of supplying a power supply potential or a reference potential to an integrated circuit formed inside the semiconductor chip CHP2. Some of the pillared bump electrodes PLBMP1 formed in the area AR1 are coupled to a power source line and some of them are coupled to a signal line.

When the pillared bump electrode PLBMP1 formed in the area AR1 is placed adjacent to the pillared bump electrode PLBMP2 formed in the area AR3, mutual interference (cross coupling) tends to occur between the pillared bump electrode PLBMP1 and the pillared bump electrode PLBMP2. Then, noise tends to occur in the power supply voltage or reference voltage to be supplied to the pillared bump electrode PLBMP2 coupled to the power source line.

The semiconductor chip CHP2 according to the second related technology has, between the area AR1 and the area AR3, the area AR2 having therein no bump electrodes and this area AR2 serves to increase the distance between the pillared bump electrode PLBMP2 formed in the area AR3 and the pillared bump electrode PLBMP1 in the area AR1. This means that in the semiconductor chip CHP2 according to the second related technology, cross coupling between the power source line coupled to the pillared bump electrode PLBMP2 formed in the area AR3 and the signal line coupled to the pillared bump electrode PLBMP1 formed in the area AR1 can be suppressed. As a result, according to the second related technology, stability of a power supply voltage or a reference voltage to be applied to a power source line coupled to the pillared bump electrode PLBMP2 formed in the area AR3 can be enhanced and therefore, an integrated circuit formed on the semiconductor chip CHP2 has improved operation stability.

Next, the fifth characteristic of the second related technology will be described. For example, as shown in FIG. 6 or FIG. 7, in the semiconductor device according to the second related technology, the through-hole wiring board THWB has, in the area AR2 and area AR3, a plurality of through-holes TH1 and through-holes TH3. This means that when the semiconductor chip CHP2 is mounted on the through-hole wiring board THWB, there are many through-holes TH1 and through-holes TH3 in areas (area AR2 and area AR3) of the through-hole wiring board THWB which overlaps with the semiconductor chip CHP2 in a plan view. Since the through-holes TH1 and the through-holes TH3 have, on the inner wall thereof, a plating film made of, for example, copper having a desirable thermal conductivity, heat generated in the semiconductor chip CHP2 can be released efficiently from these many through-holes TH1 and through-holes TH3 formed immediately below the semiconductor chip CHP2. The semiconductor device according to the second related technology therefore has improved release characteristics of heat generated in the semiconductor chip CHP2. As a result, a heat sink HS shown in FIG. 2 may be omitted. If the heat sink HS becomes unnecessary, the material cost can be reduced correspondingly.

As described above, the second related technology has at least the first to fifth characteristics. The following is the outline of these first to fifth characteristics.

(1) The first characteristic of the second related technology is that as a wiring board having the semiconductor chip CHP2 thereon, the through-hole wiring board THWB as shown in FIG. 6 is used without using the buildup wiring board BPWB as shown in FIG. 3. In the second related technology, since the through-hole wiring board THWB comprised only of the core layer CRL is used, it becomes unnecessary to consider the difference in thermal expansion coefficient between the buildup layer BPL1 (BPL2) and the core layer CRL. Moreover, the through-hole wiring board does not have the buildup layer BPL1 (BPL2) so that it becomes unnecessary to consider the electrical disconnection of a microvia VA formed in the buildup layer BPL1 (BPL2). As a result, the second related technology makes it possible to provide a semiconductor device having improved reliability while reducing a manufacturing cost.

(2) The second characteristic of the second related technology is that for example as shown in FIG. 6, a wiring layout is devised while separating the through-hole TH1 formation area, the through-hole TH2 formation area, and the terminal TE1 formation area from each other. More specifically, as shown in FIG. 6, a plurality of through-holes TH2 is provided in the area AR0 of the through-hole wiring board THWB and a plurality of terminals TE1 is provided in the area AR1 of the through-hole wiring board THWB. And, a plurality of through-holes TH1 is provided in the area AR2 of the through-hole wiring board THWB. In the second related technology, as shown in FIG. 7, the terminals TE1 to be electrically coupled to the through-holes TH2 formed in the area AR0 is placed on the side near the AR0 and the terminals TE1 to be electrically coupled to the through-holes TH1 formed in the area AR2 is placed on the side near the area AR2. According to this wiring layout of the second related technology, it becomes unnecessary to drag wirings in the area AR1 and becomes possible to efficiently couple the through-holes TH1 and the terminals TE1 to each other and efficiently couple the through-holes TH2 and the terminals TE1 to each other while separating the through-hole TH1 formation area, the through-hole TH2 formation area, and the terminal TE1 formation area from each other.

(3) The third characteristic of the second related technology is that as shown in FIG. 6, a plurality of through-holes TH3 and a plurality of terminals TE2 are formed in the area AR3 and wirings for coupling the through-holes TH3 and the terminals TE2 formed in this area AR3 are comprised only of, for example, a power supply line for supplying a power supply potential or a GND line for supplying a reference potential (GND potential). Such a configuration in the second related technology makes it possible not only to supply the semiconductor chip CHP2 with a power supply potential and a reference potential from some of the terminals TE1 formed in the area AR1 but also to supply the semiconductor chip CHP2 with a power supply potential and a reference potential from the terminals TE2 formed in the area AR3. In short, a power supply potential and a reference potential can be supplied not only from the area AR1 of the semiconductor chip CHP2 but also from the area AR3 so that a power supply voltage drop (IR drop) in the semiconductor chip CHP2 can be reduced.

(4) The fourth characteristic of the second related technology is that for example as shown in FIG. 4, the pillared bump electrode PLBMP1 (PLBMP2) is formed only in portions (the area AR1 and the area AR3) of the surface area of the semiconductor chip CHP2. This makes it possible to provide a sufficient standoff even if the size of the pillared bump electrode PLBMP1 (PLBMP2) itself is reduced so that deterioration in the filling property of the underfill or deterioration in the coupling reliability between the semiconductor chip and the through-hole wiring board THWB can be suppressed. Moreover, a semiconductor chip CHP2 suited for the through-hole wiring board THWB equipped with the second and third characteristics can be configured. Moreover, according to the fourth characteristic of the second related technology, the area AR1 and the area AR3 have therebetween the area AR2 having no bump electrode formed therein and due to the presence of this area AR2, the distance between the pillared bump electrode PLBMP2 formed in the area AR3 and the pillared bump electrode PLBMP1 formed in the area AR1 can be widened. As a result, according to the second related technology, cross coupling between a power source line coupled to the pillared bump electrode PLBMP2 formed in the area AR3 and a signal line coupled to the pillared bump electrode PLBMP1 formed in the area AR1 can be suppressed.

The second related technology therefore makes it possible to enhance the stability of a power supply voltage or a reference voltage to be applied to a power supply line coupled to the pillared bump electrode PLBMP2 formed in the area AR3 and therefore to improve the operation stability of the integrated circuit formed in the semiconductor chip CHP2.

(5) The fifth characteristic of the second related technology is that when the semiconductor chip CHP2 is mounted on the through-hole wiring board THWB, many through-holes TH1 and through-holes TH3 are present in the areas (area AR2 and area AR3) of the through-hole wiring board THWB overlapping with the semiconductor chip CHP2 in a plan view. The semiconductor device according to the second related technology, therefore, has improved release characteristics of heat generated in the semiconductor chip CHP2.

<New Problem of Second Related Technology Found by Present Inventors>

Figure 13:
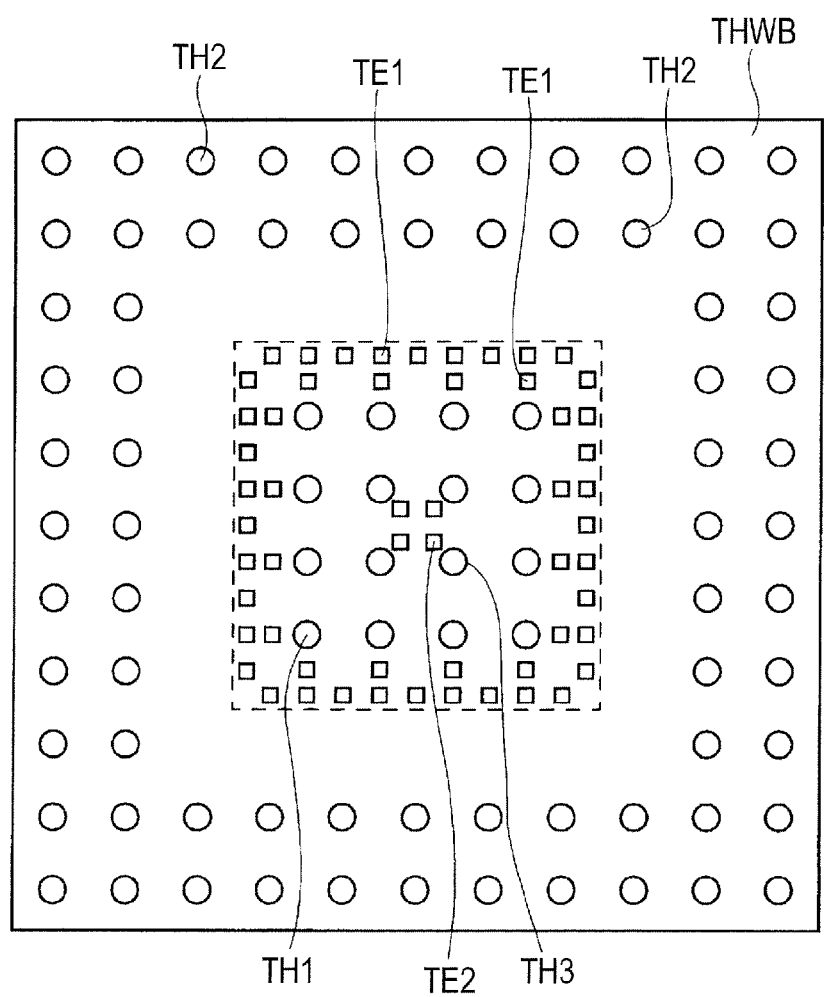
FIG. 13 is a plan view of the through-hole wiring board according to the second related technology when viewed from the surface side.

The present inventors have found a new problem of the second related technology to be investigated. It will next be described. FIG. 13 is a plan view of the through-hole wiring board THWB according to the second related technology when viewed from the surface side (main surface side, upper surface side). As shown in FIG. 13, the through-hole wiring board THWB according to the second related technology is rectangular and has a plurality of through-holes TH2 along the peripheral area of the wiring board. In FIG. 13, a plurality of through-holes TH2 is formed in two rows and a rectangular semiconductor chip CHP2 is mounted in a center area present on the inner side of the peripheral area. FIG. 13 does not show the semiconductor chip CHP2 itself and a chip mounting area in which the semiconductor chip CHP2 is to be mounted is shown by a broken line. It has been found from this FIG. 13 that the through-holes TH2 formed in the peripheral area of the through-hole wiring board THWB are placed so as not to overlap with the semiconductor chip CHP2 in a plan view.

Next, as shown in FIG. 13, a plurality of terminals TE1 is formed inside the chip mounting area in which the semiconductor chip CHP2 is mounted. More specifically, as shown in FIG. 13, a plurality of terminals TE1 is formed in two rows along a virtual line defining the chip mounting area. A plurality of through-holes TH1 is formed in an area inside these terminals TE1; a plurality of through-holes TH3 is formed in an area inside the through-holes TH1; and a plurality of terminals TE2 is formed in an area inside the through-holes TH3.

Figure 14:
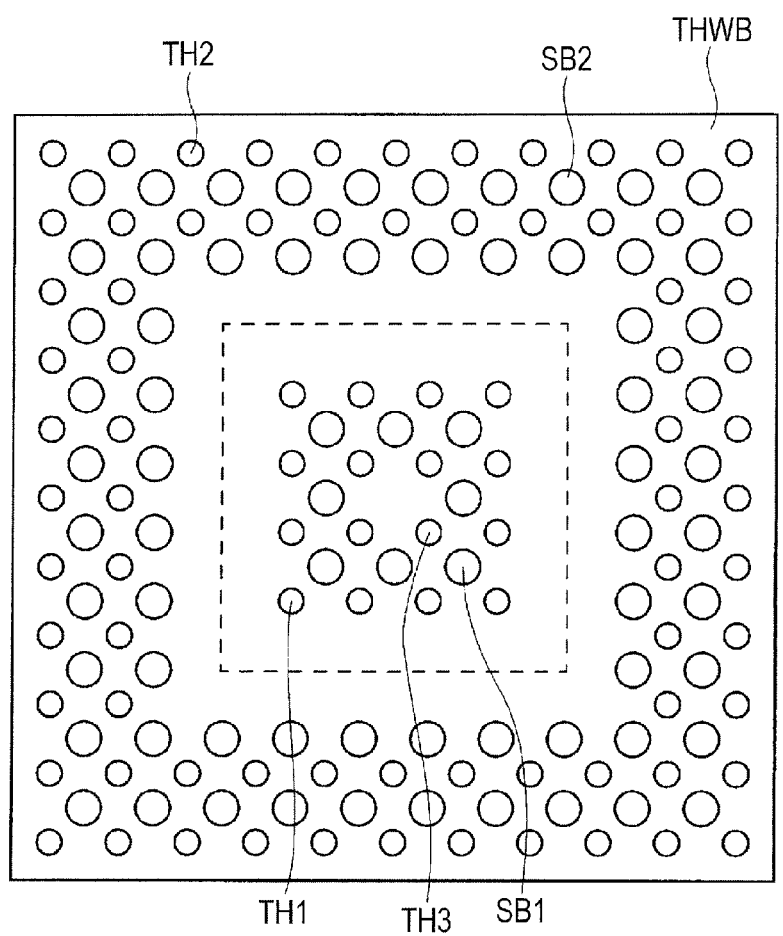
FIG. 14 is a plan view of the through-hole wiring board according to the second related technology when viewed from the back surface.

The surface side of the through-hole wiring board THWB in the second related technology has such a configuration as described above. The plan configuration of the back surface side (lower surface side) of the through-hole wiring board THWB will next be described. FIG. 14 is a plan view of the through-hole wiring board THWB according to the second related technology when viewed from the back surface side. As shown in FIG. 14, a rectangular through-hole wiring board THWB has, in an outer area therein, a plurality of solder balls SB2. The solder balls SB2 are placed, for example, in two rows as shown in FIG. 14 and these solder balls SB3 are electrically coupled to the through-holes TH2. The solder balls SB2 and the through-holes TH2 are placed so as not to overlap with each other in a plan view. These solder balls SB2 are a mixture of solder balls to which a power supply potential, a reference potential (GND potential), and a signal voltage are applied, respectively. Accordingly, lands having the solder balls SB2 thereon are a mixture of lands to which a power supply potential, a reference potential, and a signal voltage are applied, respectively.

The area having therein the solder balls SB2 embraces, in the area, a chip mounting area. FIG. 14 shows the chip mounting area present on the surface side by a broken line. Moreover, in the through-hole wiring board THWB according to the second related technology, this chip mounting area has, inside thereof, a plurality of solder balls SB1. These solder balls SB1 do not include those supplied with a signal voltage but include those supplied with a power supply potential or a reference potential. This means that the lands having thereon the solder balls SB1 include only those supplied with a power supply potential or a reference potential.

What is important here is that in the through-hole wiring board THWB according to the second related technology, solder balls SB1 should be placed so as to prevent the solder balls SB1 from overlapping with the through-holes TH1 and the through-holes TH3 in a plan view. Since the through-holes TH1 and the through-hole TH3 are formed densely in a narrow area overlapping with the chip mounting area in a plan view, the number of the solder balls SB1 to be placed in an area overlapping with the chip mounting area in a plan view is limited.

In the through-hole wiring board THWB according to the second related technology, it is necessary to (1) place the through-holes TH1 and the through-holes TH3 densely in a narrow area which overlaps with the chip mounting area in a plan view and (2) place the solder balls SB1 while avoiding the through-holes TH1 and the through-holes TH3. The through-hole wiring board THWB according to the second related technology is therefore characterized by that the number of the solder balls SB1 placed in an area overlapping with the chip mounting area in a plan view becomes smaller. This means that the number of the solder balls SBG1 placed in an inner area which overlaps with the chip mounting area in a plan view is smaller than the number of the solder balls SB2 placed in an outer area which does not overlap with the chip mounting area in a plan view. As a result, the number of the lands having thereon the solder balls SB1 is smaller than the number of the lands having thereon the solder balls SB2.

The present inventors have found newly that in the semiconductor device according to the second related technology, a decrease in the number of the solder balls SB1 formed in the area of the back surface of the through-hole wiring board THWB overlapping with the chip mounting area in a plan view may lessen the improvement in the reliability of the semiconductor device.

More specifically, the semiconductor device including the through-hole wiring board THWB having thereon the semiconductor chip CHP2 is coupled to a mounting substrate via the solder balls SB1 or solder ball SB2. This means that the through-hole wiring board THWB is mounted on the mounting substrate via a plurality of solder balls SB1 and solder balls SB2. The reliability test (temperature cycling test after mounting) after mounting of the semiconductor device on the mounting substrate has revealed the fracture and separation of the solder balls SB1 placed in an area of the back surface of the through-hole wiring board THWB overlapping with the mounting area of the semiconductor chip CHP2 in a plan view, which will be described hereinafter.

Figure 15:
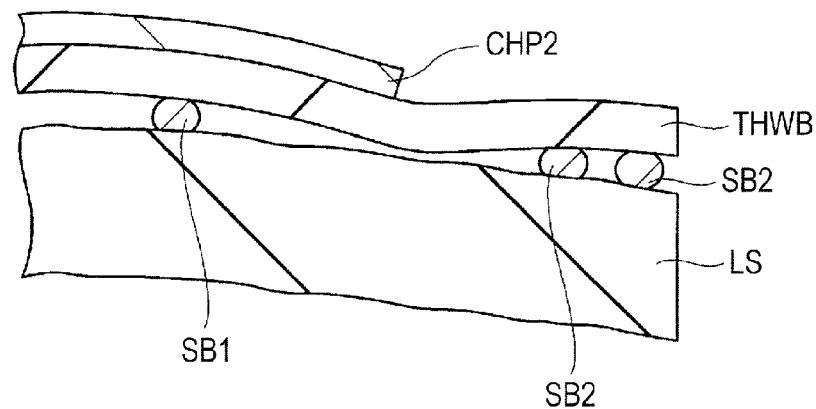
FIG. 15 is a schematic view showing the simulation of a temperature cycling test conducted with the through-hole wiring board having thereon the semiconductor chip mounted on a mounting substrate.

FIG. 15 is a schematic view showing the simulation of the temperature cycling test while mounting the through-hole wiring board THWB having thereon the semiconductor chip CHP2 on the mounting substrate LS. In FIG. 15, the through-hole wiring board THWB has thereon the semiconductor chip CHP2 and this through-hole wiring board THWB and the mounting substrate LS are coupled to each other via the solder balls SB1 and the solder balls SB2.

When the semiconductor device having such a configuration is subjected to a temperature cycling test by changing the temperature, for example, within a range of from −40° C. to 125° C., the semiconductor chip CHP2, the through-hole wiring board THWB, and the mounting substrate LS are deformed as a result of repetition of thermal expansion and thermal shrinkage (refer to FIG. 15). In particular, a large stress occurs between the semiconductor chip CHP2 comprised mainly of silicon and the through-hole wiring board THWB comprised mainly of a resin due to a difference in thermal expansion coefficient between silicon and the resin. This means that as shown in FIG. 15, a larger stress is applied to the vicinity of the chip mounting area of the through-hole wiring board THWB than to another area.

In the second related technology, since the through-hole wiring board THWB and the mounting substrate LS are coupled to each other via the solder balls SB1 and the solder balls SB2, a stress due to the deformation of the through-hole wiring board THWB and the mounting substrate LS is applied to the solder balls SB1 and the solder balls SB2.

First, with regards to the solder balls SB2, the solder balls SB2 are formed in an area of the through-hole wiring board THWB outside the chip mounting area in a plan view. This means that the solder balls SB2 are placed not in the chip mounting area where a large stress is applied but in an outer area where a stress is relatively small. Moreover, the number of the solder balls SB2 is large so that a stress applied to one solder ball SB2 is small. It is therefore presumed that the fracture and separation of the solder balls SB2 due to this stress do not become obvious.

Next, with regards to the solder balls SB1, the solder balls SB1 are formed in an area of the through-hole wiring board THWB overlapping with the chip mounting area in a plan view. This means that the solder balls SB1 are placed in an area embraced in the chip mounting area where a stress becomes large. Moreover, in the through-hole wiring board THWB according to the second related technology, for example as shown in FIG. 14, the number of the solder balls SB1 formed in an area overlapping with the chip mounting area in a plan view is limited to be small. As a result, in the second related technology, a stress applied to one solder ball SB1 becomes large and the fracture and separation of the solder balls SB1 due to the stress tend to become obvious. This means that the second related technology has the following points: (1) a stress becomes large in an area of the through-hole wiring board THWB overlapping with the chip mounting area in a plan view due to a difference in thermal expansion coefficient between the semiconductor chip CHP2 and the through-hole wiring board THWB; and (2) the number of the solder balls SB1 placed in an area overlapping with the chip mounting area in a plan view becomes small. In the second related technology, therefore, fracture and separation of the solder balls SB1 from the through-hole wiring board THWB tend to occur. In short, in the through-hole wiring board THWB in the second related technology, due to a decrease in the number of the solder balls SB1 formed in an area overlapping with the chip mounting area in a plan view, the fracture and separation of the solder balls SB1 tend to become evident.

Figure 16:
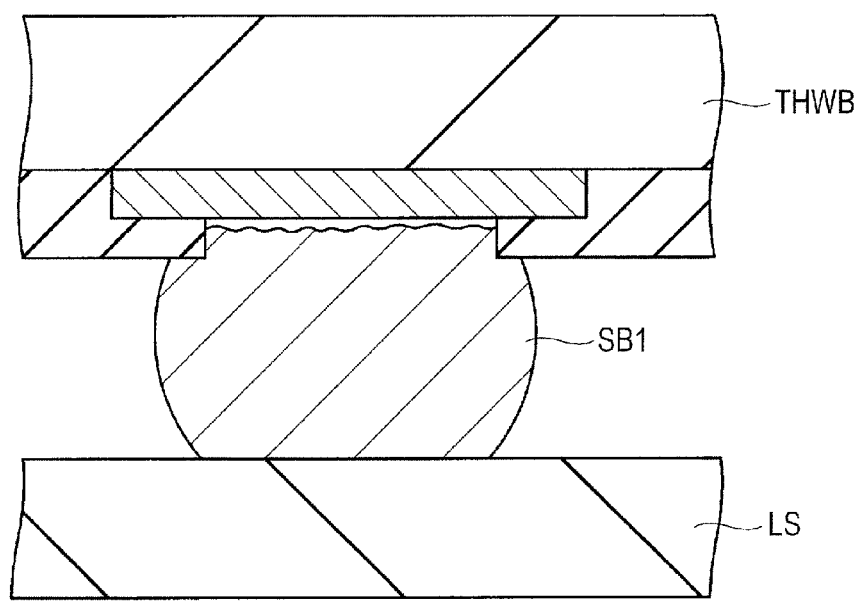
FIG. 16 shows the fracture and separation of a solder ball which has coupled the through-hole wiring board and the mounting substrate to each other.

More specifically, FIG. 16 shows the fracture and separation of the solder ball SB1 which couples the through-hole wiring board THWB to the mounting substrate LS. As is apparent from FIG. 16, the solder ball SB1 is broken and separated from the through-hole wiring board THWB. In particular, in the second related technology, SMD is employed as the configuration mode of the land so that fracture and separation of the solder ball SB1 becomes obvious. Such fracture and separation of the solder ball SB1 cause a failure of a semiconductor device. As a result, the semiconductor device thus obtained has deteriorated reliability.

As described above, in the second related technology, fracture and separation of the solder ball SB1 from the through-hole wiring board THWB becomes a problem. The solder ball SB1 is mounted on the land formed on the back surface of the through-hole wiring board THWB and thereby the solder ball SB1 is coupled to the through-hole wiring board THWB. The fracture and separation of the solder ball SB1 from the through-hole wiring board THWB occur in a boundary area between the land and the solder ball SB1 so that it is important to improve the bond strength between the land and the solder ball SB1. In the second related technology, a structure called SMD (Solder Mask Defined) is employed as the structure of the land so that particularly the fracture and separation of the solder ball SB1 from the land become obvious, which will hereinafter be described.

Figure 17:
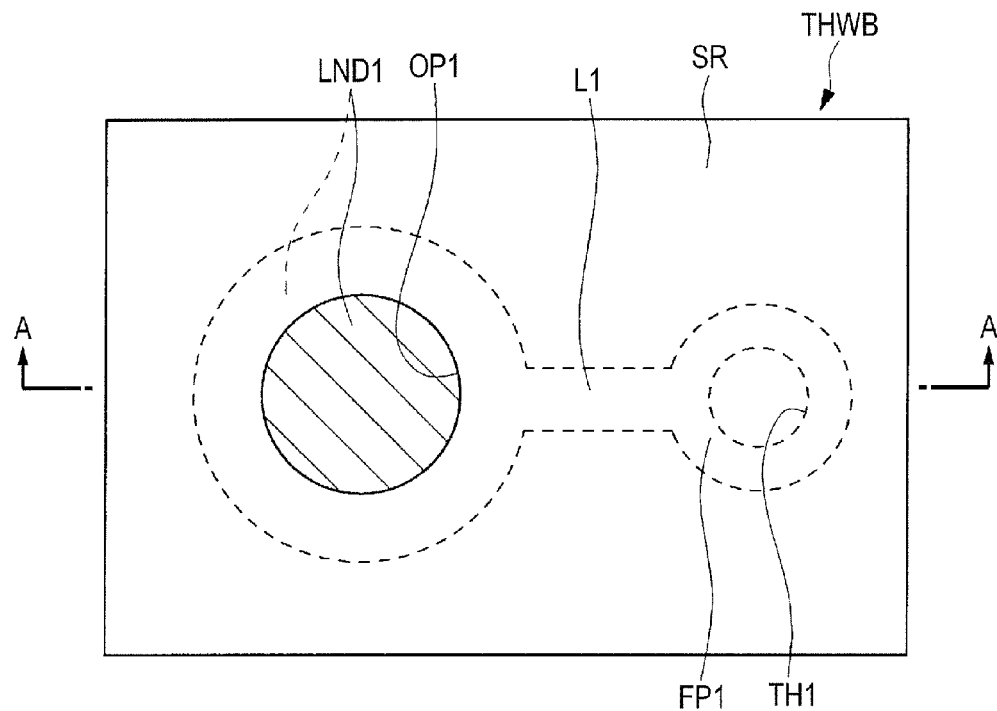
FIG. 17 shows one example of a land having an SMD structure.

FIG. 17 shows a land LND1 having an SMD structure formed on the back surface of the through-hole wiring board THWB. FIG. 17 is an enlarged view of one land LND1 formed on the back surface of the through-hole wiring board THWB and one through-hole TH1. As shown in FIG. 17, the back surface of the through-hole wiring board is covered with the solder resist SR and this solder resist SR has therein an opening portion OP1. From this opening portion OP1, the land LND1 is exposed. The land LND1 shown in FIG. 17 is greater than the opening portion OP1 formed in the solder resist SR and the land LND1 is covered, at the peripheral area thereof, with the solder resist SR. Described specifically, the land LND1 and the opening portion OP1 each have a circular shape and the diameter of the land LND1 is greater than that of the opening portion OP1. Such a configuration mode of the land LND1 is called "SMD" (Solder Mask Defined). In short, in SMD, the diameter of the land LND1 is greater than that of the opening portion OP1. Accordingly, in SMD, the entirety of the land LND1 is not exposed from the opening portion OP1 formed in the solder resist SR but the center area of the land LND1 is exposed and the peripheral area of the land LND1 is covered with the solder resist SR. In other words, SMD is a configuration mode in which the diameter of the land LND1 is greater than the diameter of the opening portion OP1 formed in the solder resist SR and at the same time, the opening portion OP1 is embraced in the land LND1 and a portion of the land LND1 is exposed.

To the land LND1, a wiring L1 is coupled and this wiring L1 is coupled to the through-hole TH1. More specifically, the through-hole wiring board THWB has, on the back surface thereof, a foot pattern FP1 embracing the through-hole TH1 so as to overlap with the through-hole TH1 in a plan view and this foot pattern FP1 is coupled to the land LND1 via the wiring L1. The through-hole TH1 and the foot pattern FP1, and the wiring L1 are covered with the solder resist SR. This means that in SMD, only a portion of the land LND1 is exposed from the opening portion OP1 and the wiring L1, the foot pattern FP1, and the through-hole TH1 coupled to the land LND1 are all covered with the solder resist SR.

Figure 18:
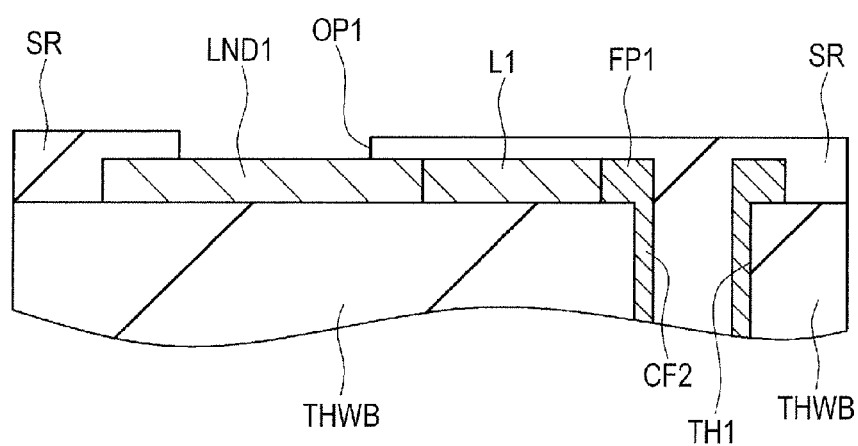
FIG. 18 is a cross-sectional view taken along a line A-A of FIG. 17.

FIG. 18 is a cross-sectional view taken along a line A-A of FIG. 17. As shown in FIG. 18, the through-hole wiring board THWB has therein the through-hole TH1 and this through-hole TH1 has, on the side surface thereof, a conductive film CF2. The foot pattern FP1, the wiring L1, and the land LND1 are integrated with each other so that they are electrically coupled to the through-hole TH1 having the conductive film CF2. The foot pattern FP1, entirety of the wiring L1, and a portion (peripheral area) of the land LND1 which have been integrated with each other are covered with the solder resist SR, while a portion (center area) of the land LND1 is exposed from the opening portion OP1 formed in the solder resist SR. Such a configuration mode of the land LND1 is SMD.

Figure 19:
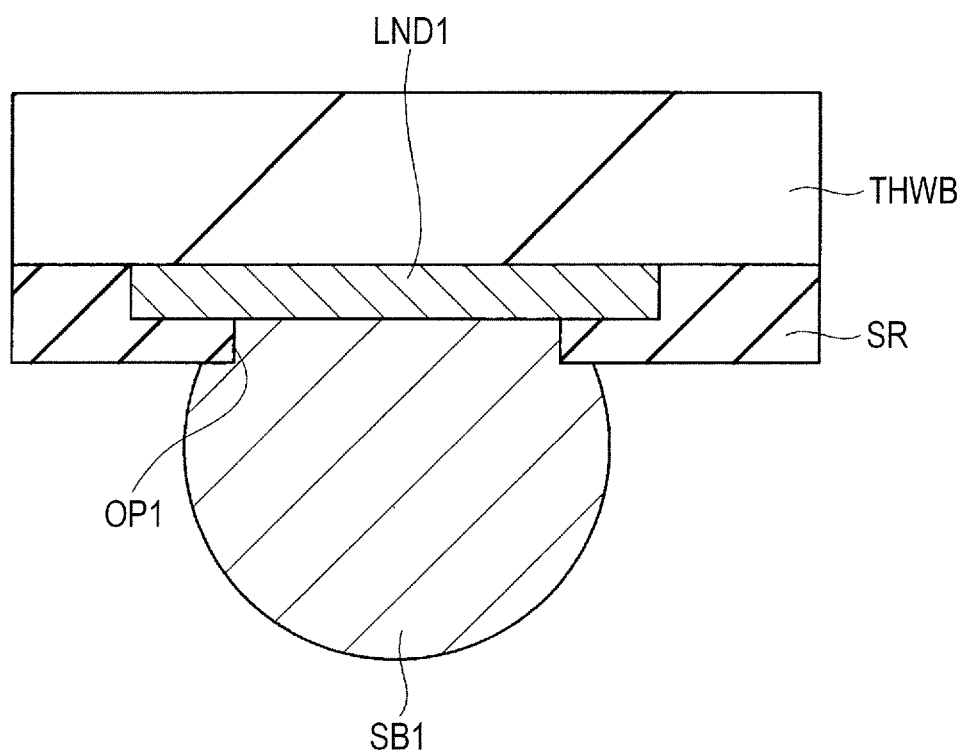
FIG. 19 is a cross-sectional view showing a solder ball mounted on the land having an SMD structure.

FIG. 19 is a cross-sectional view showing the solder ball SB1 mounted on the land LND1 having an SMD structure. As shown in FIG. 19, the through-hole wiring board THWB has, on the back surface thereof, the land LND1 and this through-hole wiring board THWB has, on the back surface including the peripheral area of this land LND1, the solder resist SR. In other words, the center area of the land LND1 is exposed from the opening portion OP1 provided in the solder resist SR. The land LND1 exposed from the opening portion OP1 provided in the solder resist SR has, on the bottom surface thereof, the solder ball SB1.

In the second related technology, the above-mentioned SMD is employed as a configuration mode of the land LND1 formed on the back surface of the through-hole wiring board THWB, because in SMD, the peripheral area of the land LND1 is covered with the solder resist SR, the adhesion between the through-hole wiring board THWB and the land LND1 can be improved. In other words, in SMD, easy separation of the land LND1 from the through-hole wiring board THWB is prevented so that it is employed as a configuration mode of the land LND1 formed on the through-hole wiring board THWB.

SMD has however the following disadvantage. Described specifically, in SMD, adhesive force between the land LND1 and the solder ball SB1 decreases in spite of the improvement in the adhesion between the through-hole wiring board THWB and the land LND1, because in SMD, the land LND1 is in contact with the solder ball SB1 only at the bottom surface of the land exposed from the opening portion OP1. As a result, when SMD is employed as a configuration mode of the land LND1 placed in an area overlapping with the chip mounting area in a plan view, the fracture and separation of the solder ball SB1 from the land LND1 becomes obvious.

For example, the through-hole wiring board THWB according to the second related technology has the following points: (1) a stress becomes large in an area of the through-hole wiring board THWB overlapping with the chip mounting area in a plan view due to a difference in thermal expansion coefficient between the semiconductor chip CHP2 and the through-hole wiring board THWB and (2) the number of the solder balls SB1 placed in an area overlapping with the chip mounting area in a plan view is limited and becomes small. A stress applied to a boundary area between the solder ball SB1 and the land LND1 placed in an area overlapping with the chip mounting area in a plan view therefore increases. If SMD in which adhesive force is weak between the land LND1 and the solder ball SB1 is employed, fracture and separation of the bolder ball SB1 from the land LND1 become obvious.

<Characteristics of Semiconductor Device in Embodiment>

In this embodiment, some measures are devised to prevent fracture and separation, from the through-hole wiring board THWB, of the solder ball SB1 placed in an area overlapping with the chip mounting area in a plan view. A description will hereinafter be made on these measures. In particular, in the present embodiment, the bond strength between the solder ball SB1 and the land is improved by paying attention to the structure of the land to be coupled to the solder ball SB1 and devising this structure of the land.

More specifically, in the present embodiment, not SMD but NSMD is employed as the configuration mode of the land LND1. This makes it possible to improve the adhesive force between the land LND1 and the solder ball SB1, thereby preventing the fracture and separation of the solder ball SB1 from the land LND1. A description will hereinafter be made on NSMD.

Figure 20:
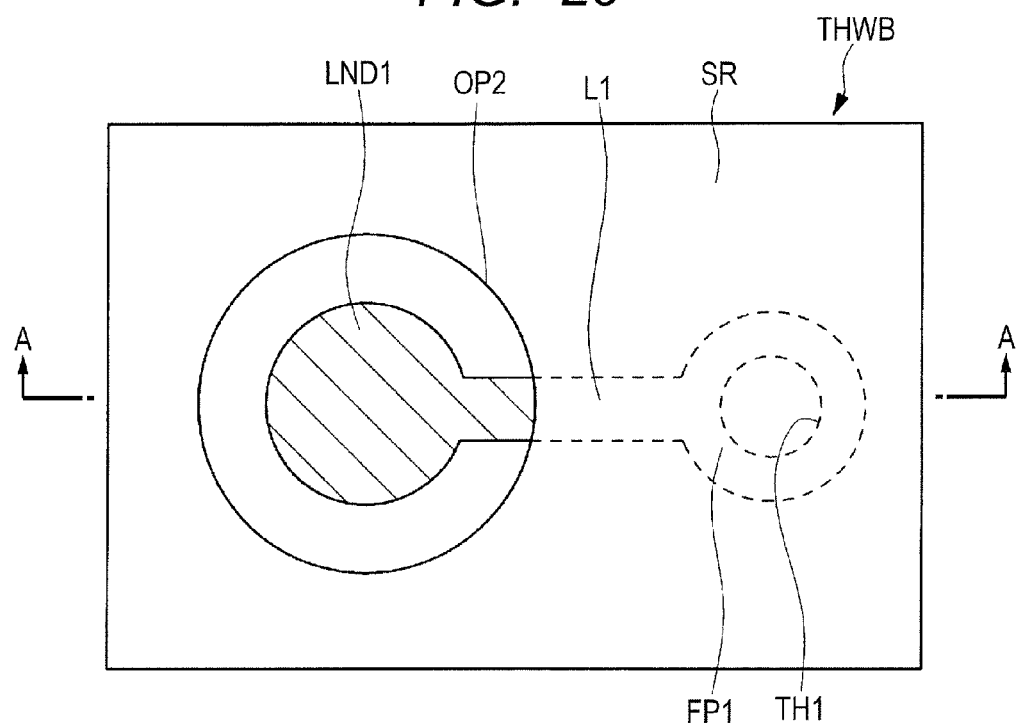
FIG. 20 shows one example of a land having an NSMD structure.

FIG. 20 shows the land LND1 formed on the back surface of the through-hole wiring board THWB and having an NSMD structure. FIG. 20 is an enlarged view of one land LND1 formed on the back surface of the through-hole wiring board THWB and one through-hole TH1. As shown in FIG. 20, the back surface of the through-hole wiring board THWB is covered with the solder resist SR and this solder resist SR has therein an opening portion OP2. The land LND1 is placed so as to be embraced with this opening portion OP2. This means that the opening portion OP2 and the land LND1 have a circular shape but the diameter of the opening portion OP2 is greater than the diameter of the land LND1. Such a configuration mode of the land LND1 is called "NSMD" (Non Solder Mask Defined).

NSMD is a configuration mode in which the diameter of the land LND1 is smaller than that of the opening portion OP2 formed in the solder resist SR and at the same time, the entirety of the land LND1 is exposed while the land LND1 is embraced in the opening portion OP2. A wiring L1 is coupled to the land LND1 exposed from the opening portion OP2 and this wiring L1 is coupled to the through-hole TH1. More specifically, a foot pattern FP1 embracing therein the through-hole TH1 is formed on the back surface of the through-hole wiring board THWB so as to overlap with the through-hole TH1 in a plan view. This foot pattern FP1 and the land LND1 are coupled to each other via the wiring L1. The through-hole TH1, the foot pattern FP1, and a portion of the wiring L1 are covered with the solder resist SR.

On the other hand, since the land LND1 is formed so as to be embraced in the opening portion OP2 formed in the solder resist SR, the land LND1 and a portion of the wiring L1 coupled to the land LND1 are exposed from the opening portion OP2. The term "land LND1" as used herein means a circular pattern as shown in FIG. 20 and it does not include the wiring L1 coupled to the circular pattern. Accordingly, the entirety of the land LND1 (circular pattern) is embraced in the opening portion OP2 provided in the solder resist SR as shown in FIG. 20, which is a characteristic of NSMD.

Figure 21:
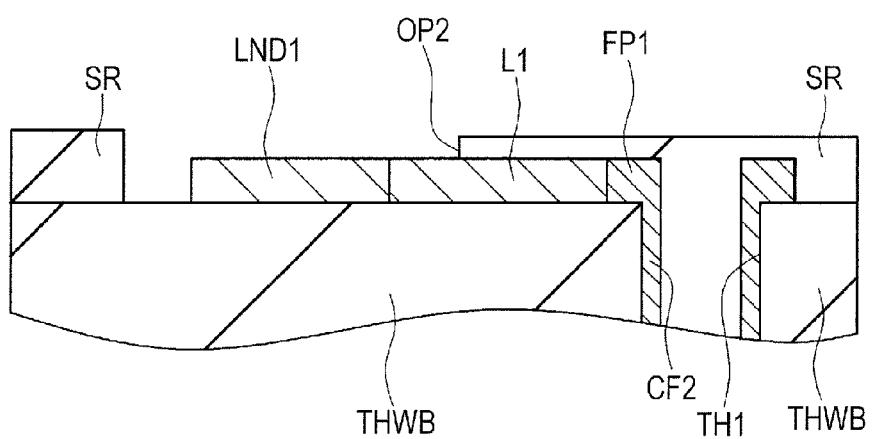
FIG. 21 is a cross-sectional view taken along a line A-A of FIG. 20.

FIG. 21 is a cross-sectional view taken along a line A-A of FIG. 20. As shown in FIG. 21, the through-hole wiring board THWB has therein the through-hole TH1 and this through-hole TH1 has, on the side surface thereof, a conductive film CF2. The foot pattern FP1, the wiring L1, and the land LND1 are integrated with each other so as to be electrically coupled to the upper portion of the through-hole TH1 having the conductive film CF2. The foot pattern FP1 and a portion of the wiring L1 integrated with each other is covered with the solder resist SR, while a portion of the wiring L1 and the land LND1 are exposed from the opening portion OP2 formed in the solder resist SR. Such a configuration mode of the land LND1 is NSMD.

Figure 22:
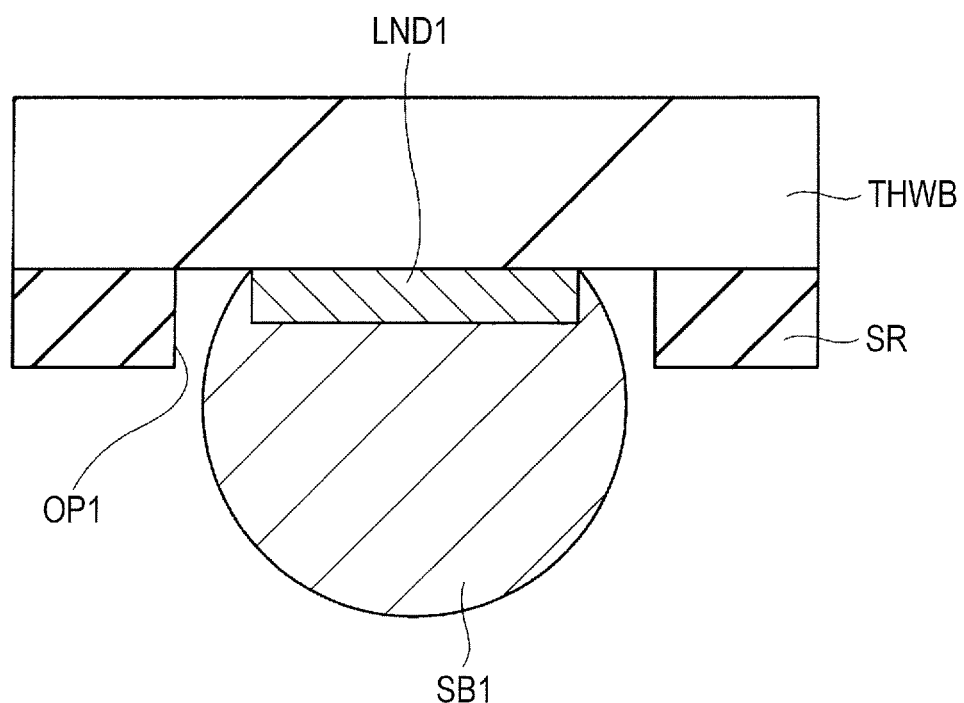
FIG. 22 is a cross-sectional view showing a solder ball mounted on the land having an NSMD structure.

FIG. 22 is a cross-sectional view showing a solder ball SB1 mounted on the land LND1 having an NSMD structure. As shown in FIG. 22, the through-hole wiring board THWB has, on the back surface thereof, a land LND1 and the through-hole wiring board THWB has, on the back surface thereof, a solder resist SR. In NSMD, the entirety of the land LND1 is exposed while being embraced in an opening portion OP2 provided in the solder resist SR. The solder ball SB1 is mounted so as to be brought into contact with the bottom surface and side surface of the land LND1 exposed from the opening portion OP1. In NSMD, the land LND1 has a bottom surface which faces the same direction with the back surface of the through-hole wiring board THWB, an upper surface opposite to the bottom surface, and a side surface located between the bottom surface and the upper surface in the thickness direction of the through-hole wiring board THWB. In a plan view, a solder is in contact with the bottom surface and the side surface of the land LND1 in a plan view.

Thus, there are two configuration modes of the land LND1 formed on the back surface of the through-hole wiring board THWB and they are NSMD and SMD. From the standpoint of improving the adhesion between the land LND1 and the solder ball SB1, NSMD is superior to SMD, because of the following reason. In SMD, since the opening portion OP1 is embraced in the land LND1, an area of the land LND1 exposed from the opening portion OP1 is only the bottom surface of the land LND1 (refer to FIG. 19).

On the other hand, in NSMD, the entirety of the land LND1 is exposed from the opening portion OP2 so that not only the bottom surface of the land LND1 but also its side surface is exposed from the opening portion OP2 (refer to FIG. 22). Described specifically, the land LND1 is made of, for example, a metal film. In SMD, only the surface of the metal film is exposed, while in NSMD, not only the surface of the metal film but also the side surface of the metal film in the film thickness direction is exposed. Compared with SMD, the exposed area of NSMD is therefore greater and the adhesion area of the solder ball SB1 mounted on the land LND1 becomes greater.

This means that adhesion of the land with the solder ball SB1 is better in NSMD than in SMD. In consideration of the improvement in bond strength between the land LND1 and the solder ball SB1, NSMD is superior to SMD.

The first characteristic of the present embodiment is that NSMD is employed as the configuration mode of the land LND1 placed in an area of the back surface of the through-hole wiring board THWB overlapping with the chip mounting area in a plan view. When NSMD is employed, the land LND1 is brought into contact with the solder ball SB1 not only at the bottom surface of the land but also the side surface thereof, making it possible to improve the bond strength between the land LND1 and the solder ball SB1. As a result, according to the present embodiment, the fracture and separation of the solder ball SB1 from the land LND1 can effectively be suppressed.

For example, even in the through-hole wiring board THWB of the present embodiment, (1) a stress becomes large in an area of the through-hole wiring board THWB overlapping with the chip mounting area in a plan view due to a difference in thermal expansion coefficient between the semiconductor chip CHP2 and the through-hole wiring board THWB and (2) the number of the solder balls SB1 placed in an area overlapping with the chip mounting area in a plan view becomes small. This increases a stress applied to a boundary area between the solder ball SB1 and the land LND1 placed in an area overlapping with the chip mounting area in a plan view. When SMD in which the adhesive force between the land LND1 and the solder ball SB1 is weak, the fracture and separation of the solder ball SB1 from the land LND1 tend to occur.

In this point, in the present embodiment, NSMD is employed as a configuration mode of the land LND1 placed in an area of the back surface of the through-hole wiring board THWB overlapping with the chip mounting area in a plan view. Using the land LND1 having an NSMD structure makes it possible to improve the bond strength between the land LND1 and the solder ball SB1 so that even if the through-hole wiring board THWB has the above-mentioned problem, the fracture and separation of the solder ball SB1 from the land LND1 can effectively be suppressed according to the present embodiment.

The present embodiment is characterized by using NSMD as the configuration mode of the land LND1, but the land LND1 itself is not covered with the solder resist SR in this NSMD. Compared with SMD in which the peripheral area of the land LND1 is covered with the solder resist SR, the adhesive force between the through-hole wiring board THWB and the land LND1 is presumed to be weaker. This means that in NSMD, the adhesive force between the land LND1 and the solder ball SB1 can be made greater than that in SMD, while the adhesive force between the through-hole wiring board THWB and the land LND1 becomes smaller than that in SMD. There is a fear that the land LND1 is separated from the through-hole wiring board THWB in NSMD, but now it becomes less necessary to fear it, because a technology of forming an adhesive layer called primer has recently been established for bonding of the through-hole wiring board THWB to the land LND1. Even in NSMD, sufficient bond strength can be secured between the through-hole wiring board THWB and the land LND1 so that the above-mentioned fear does not become obvious.

It is rather necessary to improve the adhesive force between the land LND1 and the solder ball SB1. In the reliability test (temperature cycling test after mounting) after the semiconductor device is mounted on a mounting substrate, the solder ball SB1 placed in an area of the back surface of the through-hole wiring board THWB overlapping with a mounting area of the semiconductor chip CHP2 in a plan view is broken and separated from the land LND1. It is therefore important to improve the adhesive force between the land LND1 and the solder ball SB1.

Thus, the first characteristic of the present embodiment is that NSMD is employed as the configuration mode of the land LND1 placed in at least an area of the back surface of the through-hole wiring board THWB overlapping with the chip mounting area in a plan view.

The second characteristic of the present embodiment is that the size of the solder ball SB1 is made larger. More specifically, the solder ball SB1 with a diameter of 0.45 mm is used when SMD is employed. When NSMD is employed as in the present embodiment, the solder ball SB1 with a diameter of 0.50 mm is used. In this case, since the volume of the solder ball SB1 itself becomes large, a stress to be applied to a joint between the solder ball and the land LND1 can be relaxed with the deformation of the solder ball SB1 itself even if a temperature cycling test after mounting is performed. As a result, the fracture and separation of the solder ball SB1 from the land LND1 can be suppressed.

The third characteristic of the present embodiment is that the thickness of the through-hole wiring board THWB is greater than the thickness of the semiconductor chip CHP2. More specifically, the through-hole wiring board THWB includes a core material (core layer CRL) (refer to FIG. 6) and the thickness of the core material is 1.2 times or more but not more than 2 times the thickness of the semiconductor chip CHP2. This makes it possible to prevent warpage of the through-hole wiring board THWB. When the temperature cycling test after mounting is conducted, there occurs warpage (deformation) of the through-hole wiring board THWB, depending on a difference in thermal expansion coefficient, because the through-hole wiring board THWB and the semiconductor chip CHP2 differ from each other in thermal expansion coefficient. The warpage of the through-hole wiring board THWB leads to a stress to a joint (boundary area) between the land LND1 and the solder ball SB1. In particular, with an increase in the warpage of the through-hole wiring board THWB, the stress applied to the joint between the land LND1 and the solder ball SB1 becomes greater. In order to suppress the stress to be added to the joint between the land LND1 and the solder ball SB1, it is desired to reduce the warpage of the through-hole wiring board THWB.

In the present embodiment, the rigidity of the through-hole wiring board THWB is enhanced, for example, by making the thickness of the through-hole wiring board THWB greater than the thickness of the semiconductor chip CHP2 so that the thickness of the core material configuring the through-hole wiring board THWB becomes 1.2 times or more but not more than 2 times the thickness of the semiconductor chip CHP2. The warpage of the through-hole wiring board THWB due to a difference in thermal expansion coefficient between the through-hole wiring board THWB and the semiconductor chip CHP2 can be reduced because the through-hole wiring board THWB has high rigidity. As a result, the present embodiment makes it possible to suppress a stress to be added to the joint between the land LND1 and the solder ball SB1, thereby preventing the fracture and separation of the solder ball SB1 from the land LND1.

The present embodiment has the first to third characteristics as described above and these first to third characteristics will next be summarized as follows.

(1) In the present embodiment, NSMD is employed as the configuration mode of the land LND1 placed in at least an area of the back surface of the through-hole wiring board THWB overlapping with the chip mounting area in a plan view. In NSMD, the land LND1 is brought into contact with the solder ball SB1 not only at the bottom surface but also at the side surface so that the bond strength between the land LND1 and the solder ball SB1 can be improved.

(2) In the present embodiment, the size of the solder ball SB1 to be mounted on the land LND1 having an NSMD structure employed in the present embodiment is made greater than the size of the solder ball SB1 to be mounted on the land LND1 having an SMD structure. This makes it possible to increase the volume of the solder ball SB1 itself, thereby relaxing the stress at the joint between the land LND1 and the solder ball SB1.

(3) In the present embodiment, the thickness of the through-hole wiring board THWB is made greater than the thickness of semiconductor chip CHP2 so as to make the thickness of the core material configuring the through-hole wiring board THWB 1.2 times or more but not more than 2 times the thickness of the semiconductor chip CHP2. This makes it possible to enhance the rigidity of the through-hole wiring board THWB. As a result, even if temperature cycling is applied, warpage of the through-hole wiring board THWB can be reduced.

In the present embodiment, due to the synergistic effect of these first to third characteristics, the fracture and separation of the solder ball SB1 from the land LND1 can be suppressed effectively. The semiconductor device obtained according to the present embodiment has therefore has improved reliability. It is to be noted that the semiconductor device according to the present embodiment also has characteristics described above in the second related technology.

<Specific Application Mode of Embodiment>

Figure 23:
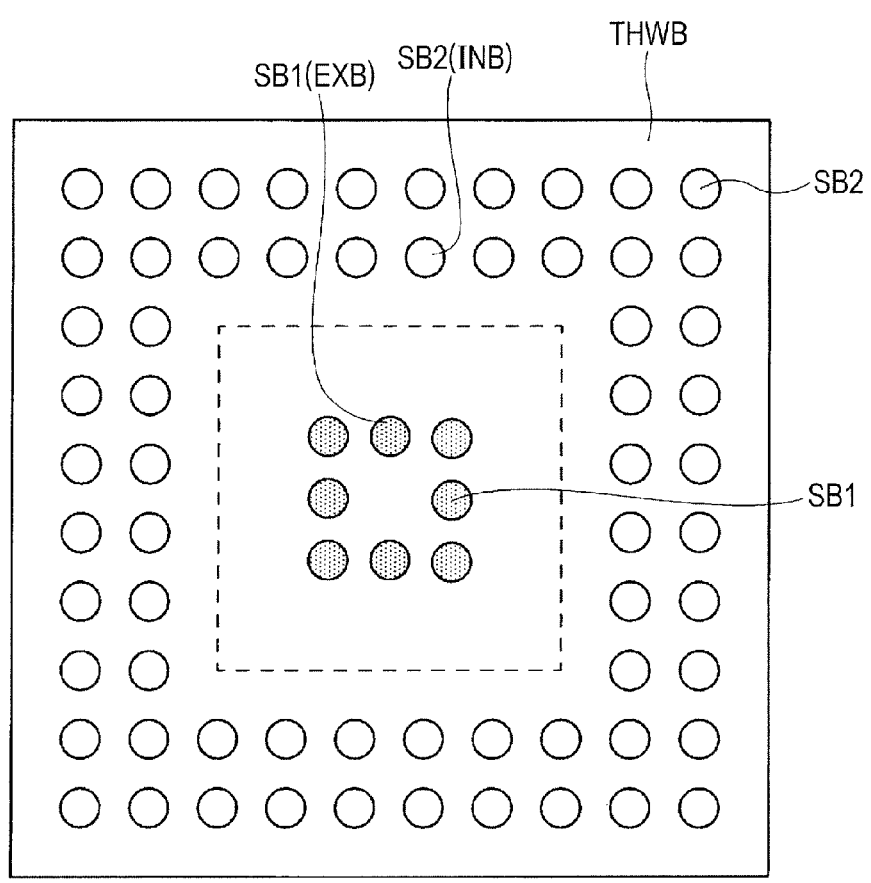
FIG. 23 is a plan view showing the configuration of a through-hole wiring board according to an embodiment.

Various application modes which have actualized the technical concept of the present embodiment will next be described. FIG. 23 is a plan view showing the configuration of a through-hole wiring board THWB according to the present embodiment. FIG. 23 shows the back surface of the through-hole wiring board THWB. In FIG. 23, the rectangular through-hole wiring board THWB has, in an outer area thereof, a plurality of solder balls SB2. A chip mounting area is formed so as to be embraced in the outer area having therein a plurality of solder balls SB2. Since a semiconductor chip CHP2 is mounted on the surface of the through-hole wiring board THWB, it is not illustrated in the drawing of the through-hole wiring board THWB of FIG. 23. In FIG. 23, however, an area (which will be sometimes called "chip mounting area" herein) overlapping with the chip mounting area in a plan view is indicated by a broken line. Next, in FIG. 23, the solder ball SB1 is placed in an inner area of the chip mounting area. The term "outer area" means an area outside the chip mounting area and the term "inner area" means an area inside the chip mounting area.

In FIG. 23, a plurality of solder balls SB1 has first external balls EXB placed at the outermost periphery of the plurality of solder balls SB1, while a plurality of solder balls SB2 has second internal balls INB placed at the innermost periphery of the plurality of solder balls SB2 and adjacent to the first external balls EXB. The distance between the first external balls EXB and the second internal balls INB becomes the largest among the distances between the solder balls adjacent to each other. The semiconductor chip is mounted on the surface (main surface, upper surface) of the through-hole wiring board THWB so that the outer edge portion (broken line) of the semiconductor chip is placed between the first external balls EXB and the second internal balls INB in a plan view.

Next, a description will be made while paying attention to a land. The land corresponding to the solder ball SB1 is called "first land" and the land corresponding to the solder ball SB2 is called "second land". In this case, a plurality of first lands has first external lands placed at the outermost periphery of the plurality of first lands and a plurality of second lands has second lands placed at the innermost periphery of the plurality of second lands and adjacent to the first external lands. The distance between the first external lands and the second internal lands is the largest among the distances between the lands adjacent to each other. The semiconductor chip is mounted on the surface (main surface, upper surface) of the through-hole wiring board THWB so that the outer peripheral portion (broken line) of the semiconductor chip is placed between the first external land and the second internal land in a plan view.

In FIG. 23, the characteristic of the present embodiment is that the lands placed in the inner area of the chip mounting area and having the solder balls SB1 thereon have an NSMD structure. This means that in FIG. 23, the lands placed on the back surface of the through-hole wiring board THWB so as to overlap with the chip mounting area in a plan view and having the solder ball SB1 thereon have an NSMD structure. More specifically, in FIG. 23, the lands corresponding to the dotted solder ball SB1 have an NSMD structure. Thus, according to the present embodiment, the lands placed in at least an area of the back surface of the through-hole wiring board THWB overlapping with the chip mounting area in a plan view uses NSMD as its configuration mode. When NSMD is employed, the lands are brought into contact with the solder ball SB1 not only at the bottom surface but also the side surface of the lands, making it possible to improve the bond strength between the lands and the solder balls SB1.

Figure 24:
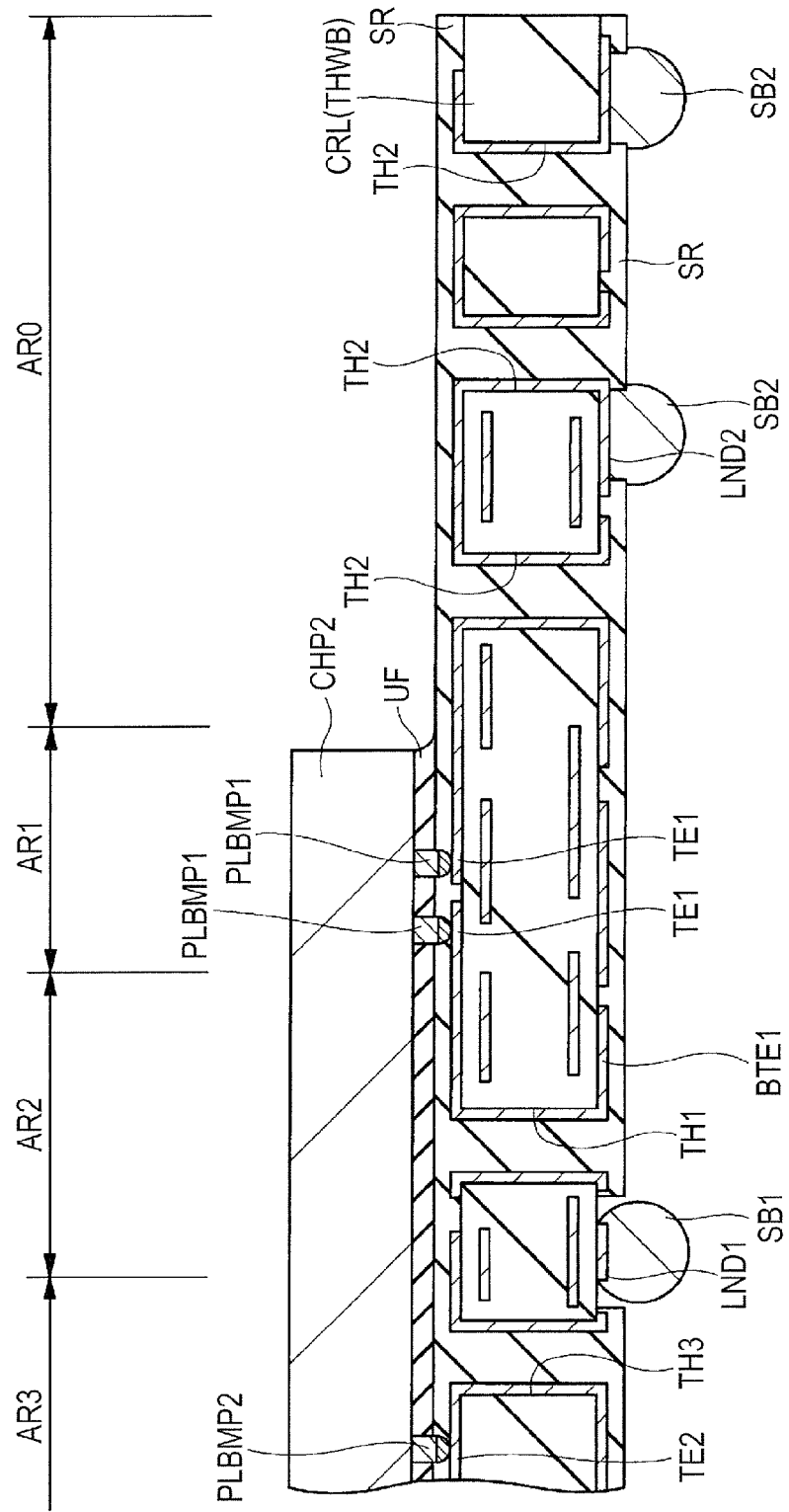
FIG. 24 shows a portion of a semiconductor device according to the embodiment and also shows an internal structure of a through-hole wiring board.

FIG. 24 shows a portion of the semiconductor device according to the present embodiment and it shows an internal structure of the through-hole wiring board THWB. In the present embodiment, as shown in FIG. 24, the through-hole wiring board THWB is made of a core layer CRL containing a glass cloth. This through-hole wiring board THWB has therein through-holes TH1, TH2, and TH3 which penetrate from the surface (upper surface) to the back surface (lower surface) of the through-hole wiring board THWB. The through-hole wiring board THWB has, on the surface thereof, a solder resist SR (first solder resist) and with this solder resist SR, the through-holes TH1, TH2, and TH3 is filled. The solder resist SR has therein an opening portion and from this opening portion, a plurality of terminals TE1 and a plurality of terminals TE2 are exposed.

For example, the through-hole wiring board THWB has, on the surface thereof, a plurality of terminals TE1 and some of these terminals TE1 are electrically coupled to the through-hole TH1 on the surface of the through-hole wiring board THWB, while the other terminals TE1 are electrically coupled to the through-hole TH2 on the surface of the through-hole wiring board THWB. In addition, the through-hole wiring board THWB has, on the surface thereof, a plurality of terminals TE2 and these terminals TE2 are electrically coupled to the through-hole TH3 on the surface of the through-hole wiring board THWB. At this time, the through-hole wiring board THWB has thereon a semiconductor chip CHP2 and a pillared bump electrode PLBM P1 formed on the semiconductor chip CHP2 is electrically coupled to the terminal TE1 formed on the surface of the through-hole wiring board THWB. Similarly, a pillared bump electrode PLBMP2 formed on the semiconductor chip CHP2 is electrically coupled to the terminal TE2 formed on the surface of the through-hole wiring board THWB. This means that the through-hole wiring board THWB has only one wiring layer on each of the surface and back surface of the core layer CRL. In the semiconductor device according to the second related technology, a pillared bump electrode is electrically coupled to this wiring layer directly.

On the other hand, the through-hole wiring board THWB has, on the back surface thereof, a solder resist SR (second solder resist). The solder resist SR has therein an opening portion and from this opening portion, a plurality of lands LND1 (back surface terminals) and a plurality of lands LND2 are exposed. These lands LND1 are electrically coupled to the through-holes TH1 and TH3 on the back surface of the through-hole wiring board THWB and the lands LND2 are electrically coupled to the through-hole TH2 on the back surface of the through-hole wiring board THWB. These lands LND1 have thereon a solder ball SB1 and the lands LND2 have thereon a solder ball SB2. More specifically, in the through-hole wiring board THWB according to the second related technology, the thickness of the wiring board (in consideration of the wiring thickness of the surface and the back surface) attributable to the core layer CRL (about 0.4 mm) is about 0.5 mm and a through-hole diameter is about 150 µm.

In the present embodiment, as shown in FIG. 24, the lands LND1 formed in an area of the back surface of the through-hole wiring board THWB overlapping with the chip mounting area in a plan view has an NSMD structure. On the other hand, the lands LND2 formed in an outer area not overlapping with the chip mounting area in a plan view have an SMD structure. In NSMD, the lands LND1 are brought into contact with the solder balls SB1 not only at the bottom surface but also at the side surface of the lands, making it possible to improve the bond strength between the lands LND1 and the solder balls SB1. As a result, according to the present embodiment, even if a stress due to temperature cycling is applied to the solder balls SB1 which have coupled the through-hole wiring board THWB and a mounting substrate to each other, fracture and separation of the solder balls 1 from the lands LND1 can be suppressed effectively. In particular, since NSMD which provides great adhesion with the solder balls SB1 is employed as the structure of the lands LND1 in an area overlapping, in a plan view, with the chip mounting area where stress becomes large, fracture and separation of the solder balls SB1 from the lands LND1 can be suppressed effectively. As a result, in the present embodiment, a semiconductor device having improved reliability can be provided.

Modification Example 1

Figure 25:
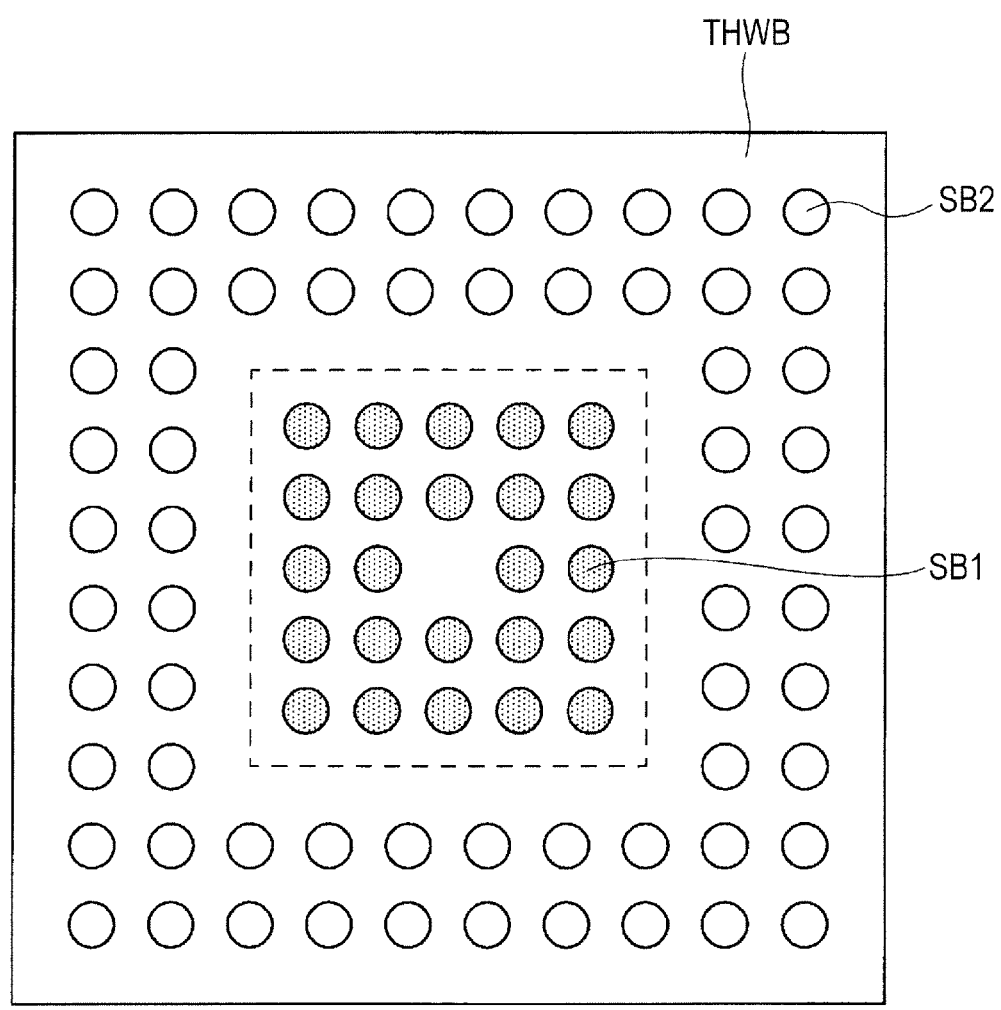
FIG. 25 is a plan view showing the configuration of a through-hole wiring board according to Modification Example 1.

FIG. 25 is a plan view showing the configuration of a through-hole wiring board THWB according to the present modification example 1. FIG. 25 shows the back surface of the through-hole wiring board THWB. In the present modification example 1, as shown in FIG. 25, the number of the solder balls SB1 placed in an inner area of the chip mounting area is greater than that shown in FIG. 23. More specifically, in FIG. 23, the solder balls SB1 formed in the inner area are placed in one row, while in the present modification example 1 shown in FIG. 25, the solder balls SB1 formed in the inner area are placed in two rows. Also in this case, all the lands having thereon the solder balls SB1 and placed in the inner area of the chip mounting area have an NSMD structure. This means that in FIG. 25, the lands having thereon the solder balls SB1 and placed in an area of the back surface of the through-hole wiring board THWB overlapping with the chip mounting area in a plan view have an NSMD structure. More specifically, in FIG. 25, the lands corresponding to the dotted solder balls SB1 have an NSMD structure. Thus, according to the present modification example 1, the lands placed in at least an area of the back surface of the through-hole wiring board THWB overlapping with the chip mounting area in a plan view use NSMD as its configuration mode. In NSMD, the lands are brought into contact with the solder balls SB1 not only at the bottom surface but also at the side surface of the lands so that the bond strength between the lands and the solder balls SB1 can be improved.

Modification Example 2

Figure 26:
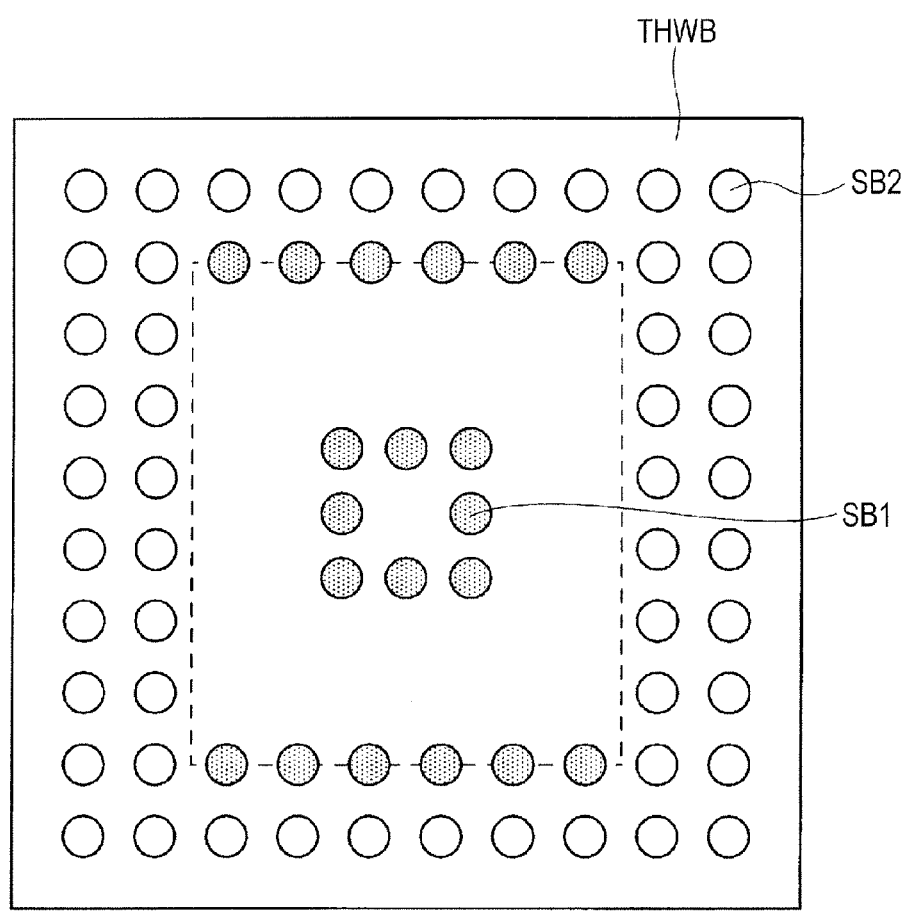
FIG. 26 is a plan view showing the configuration of a through-hole wiring board according to Modification Example 2.

FIG. 26 is a plan view showing the configuration of a through-hole wiring board THWB according to the present modification example 2. FIG. 26 shows the back surface of the through-hole wiring board THWB. In the present modification example 2, as shown in FIG. 26, a semiconductor chip to be mounted on the through-hole wiring board THWB has an increased size, which correspondingly increases the size of a chip mounting area. From the drawing, it is apparent that the broken line corresponding to the end portion of the chip mounting area partially overlaps with some of the solder balls SB2 placed in an outer area of the chip mounting area. Also in the present modification example 2 having such a configuration, all the lands having thereon solder balls SB1 placed in an inner area of the chip mounting area have an NSMD structure. Moreover, in the present modification example 2, the lands having thereon the solder balls SB2 which partially overlap with the end portion of the chip mounting area in a plan view have an NSMD structure, because in the present modification example 2, the solder balls SB2 partially overlapping with the end portion of the chip mounting area in a plan view are presumed to be subjected to a greater stress. In short, in the present modification example 2, not only the lands having thereon the solder balls SB1 placed in the inner area of the chip mounting area but also the solder balls SB2 partially overlapping with the end portion of the chip mounting area in a plan view have an NSMD structure.

More specifically, in FIG. 26, the lands corresponding to the dotted solder balls SB1 and the dotted solder balls SB2 have an NSMD structure. Thus, in the present modification example 2, the lands placed in at least an area of the back surface of the through-hole wiring board THWB overlapping with the chip mounting area in a plan view have an NSMD structure. In NSMD, the lands are brought into contact with the solder balls SB1 or solder balls SB2 not only at the bottom surface but also the side surface of the lands so that the bond strength between the lands and the bolder balls SB1 or the lands and the solder balls SB2 can be improved.

Modification Example 3

Figure 27:
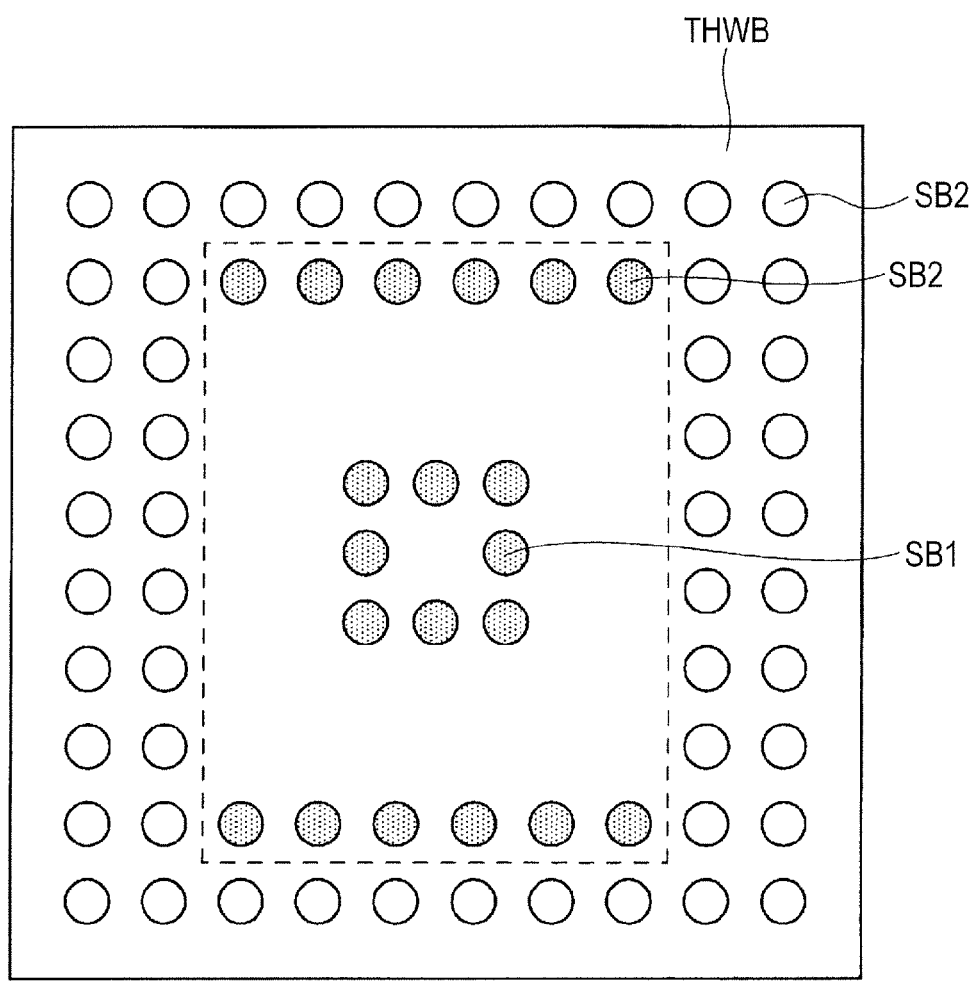
FIG. 27 is a plan view showing the configuration of a through-hole wiring board according to Modification Example 3.

FIG. 27 is a plan view showing the configuration of a through-hole wiring board THWB according to the present modification example 3. FIG. 27 shows the back surface of the through-hole wiring board THWB. In the present modification example 3 shown in FIG. 27, a semiconductor chip to be mounted on the through-hole wiring board THWB has a larger size, by which the size of a chip mounting area becomes greater. From this drawing, it is apparent that the broken line corresponding to the end portion of the chip mounting area embraces some of the solder balls SB2 placed in the outer area of the chip mounting area. Even in the present modification example 3 having such a configuration, all the lands mounting thereon the solder balls SB1 placed in the inner area of the chip mounting area have an NSMD structure. Moreover, in the present modification example 3, the lands mounting thereon the solder balls SB2 overlapping with the chip mounting area in a plan view have also an NSMD structure, because in the present modification Example 3, the solder balls SB2 overlapping with the chip mounting area in a plan view are presumed to be subjected to a large stress. In short, in the present modification example 3, not only the lands on which the solder balls SB1 placed in the inner area of the chip mounting area are to be mounted but also the lands on which some of the solder balls SB2 overlapping with the chip mounting area in a plan view are to be mounted have an NSMD structure.

More specifically, FIG. 27 shows that the lands corresponding to the dotted solder balls SB1 and the dotted solder balls SB2 have an NSMD structure. Thus, in the present modification example 3, the lands placed in at least an area of the back surface of the through-hole wiring board THWB overlapping with the chip mounting area in a plan view employs NSMD as a configuration mode. In NSMD, the lands are brought into contact with the solder balls SB1 and solder balls SB2 not only at the bottom surface but also the side surface of the lands and therefore, the bond strength between the lands and the solder balls SB1 or the bond strength between the lands and the solder ball SB2 can be improved.

Modification Example 4

Figure 28:
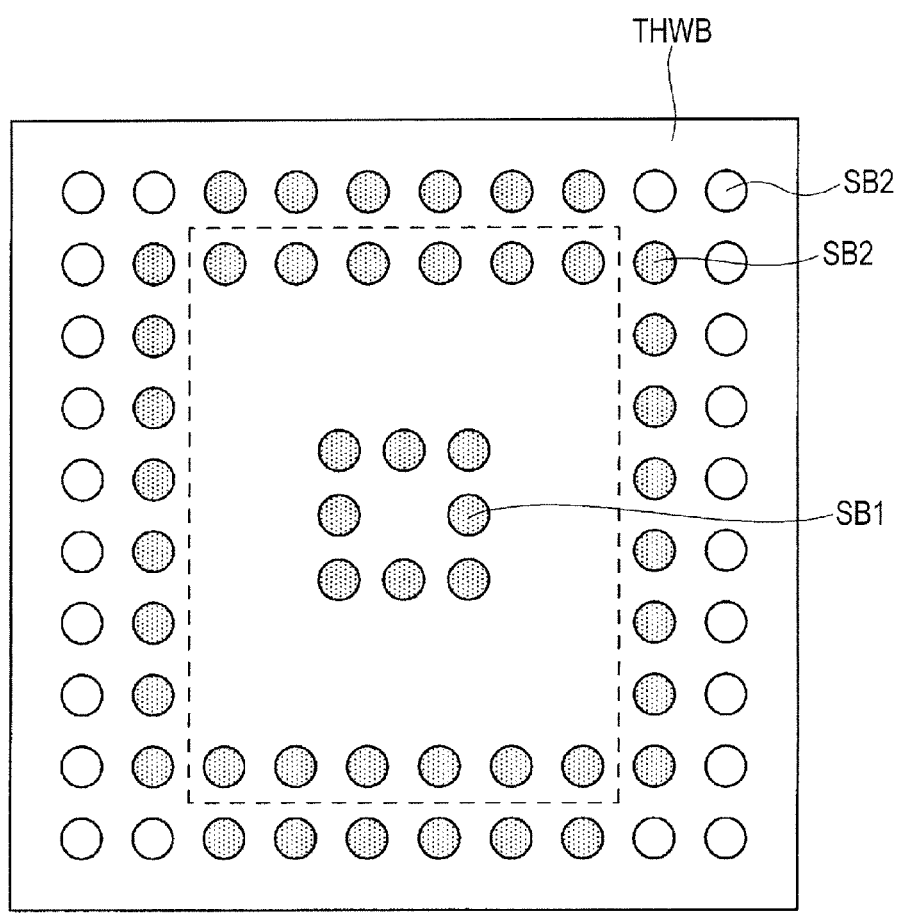
FIG. 28 is a plan view showing the configuration of a through-hole wiring board according to Modification Example 4.

FIG. 28 is a plan view showing the configuration of a through-hole wiring board THWB according to the present modification example 4. FIG. 28 shows the back surface of the through-hole wiring board THWB. In the present modification example 4 shown in FIG. 28, the semiconductor chip to be mounted on the through-hole wiring board THWB has a greater size, by which the size of the chip mounting area becomes larger. From the drawing, it is apparent that the broken line corresponding to the end portion of the chip mounting area embraces some of the solder balls SB2 placed in an outer area of the chip mounting area. Even in the present modification example 4 having such a configuration, all the lands on which the solder balls SB1 placed in the inner area of the chip mounting area are to be mounted have an NSMD structure. Moreover, in the present modification example 4, the lands on which the solder balls SB2 overlapping with the chip mounting area in a plan view are to be mounted have an NSMD structure, because in the present modification example 4, the solder balls SB2 overlapping with the chip mounting area in a plan view are presumed to be subjected to large stress.

In the present modification example 4, also the lands on which the solder balls SB2 closest to the end portion (broken line) of the chip mounting area, among the solder balls SB2 placed in an outer area of the chip mounting area, are to be mounted have an NSMD structure, because, among the solder balls SB1 and solder balls SB2 formed on the back surface of the through-hole wiring board THWB, the solder balls subjected to a greatest stress are solder balls placed in an area overlapping with the chip mounting area in a plan view. A great stress is presumed to be applied also to the solder balls closest to the chip mounting area even if they do not overlap with the chip mounting area in a plan view. In the present modification example 4, therefore, the lands on which the solder balls SB2 closest to the end portion (broken line) of the chip mounting area, among the solder balls SB2 placed in the outer region of the chip mounting area, are to be mounted have also an NSMD structure. This makes it possible to provide a semiconductor device having improved reliability.

The term "the closest" as used herein means that the solder balls are placed at a position shortest from the end portion (broken line) of the chip mounting area and for example, this distance is shorter than the distance between the solder balls SB2 adjacent to each other.

Thus, in the present modification example 4, not only the lands on which the solder balls SB1 placed in the inner area of the chip mounting area are to be mounted but also the lands on which some of the solder balls SB2 overlapping with the chip mounting area in a plan view are to be mounted have an NSMD structure. Moreover, the lands which are placed in the outer area of the chip mounting area but placed at a position closest to the chip mounting area have also an NSMD structure.

More specifically, FIG. 28 shows that the lands corresponding to the dotted solder balls SB1 and the dotted solder balls SB2 have an NSMD structure. Thus, according to the present modification example 4, not only the lands placed in at least an area of the back surface of the through-hole wiring board THWB overlapping with the chip mounting area in a plan view but also the lands closest to the chip mounting area employ NSMD as their configuration mode. In NSMD, the lands are brought into contact with the solder balls SB1 or the solder balls SB2 not only at the bottom surface but also at the side surface of the lands and therefore, the bond strength between the lands and the solder balls SB1 or the lands and the solder balls SB2 can be improved.

Modification Example 5

Figure 29:
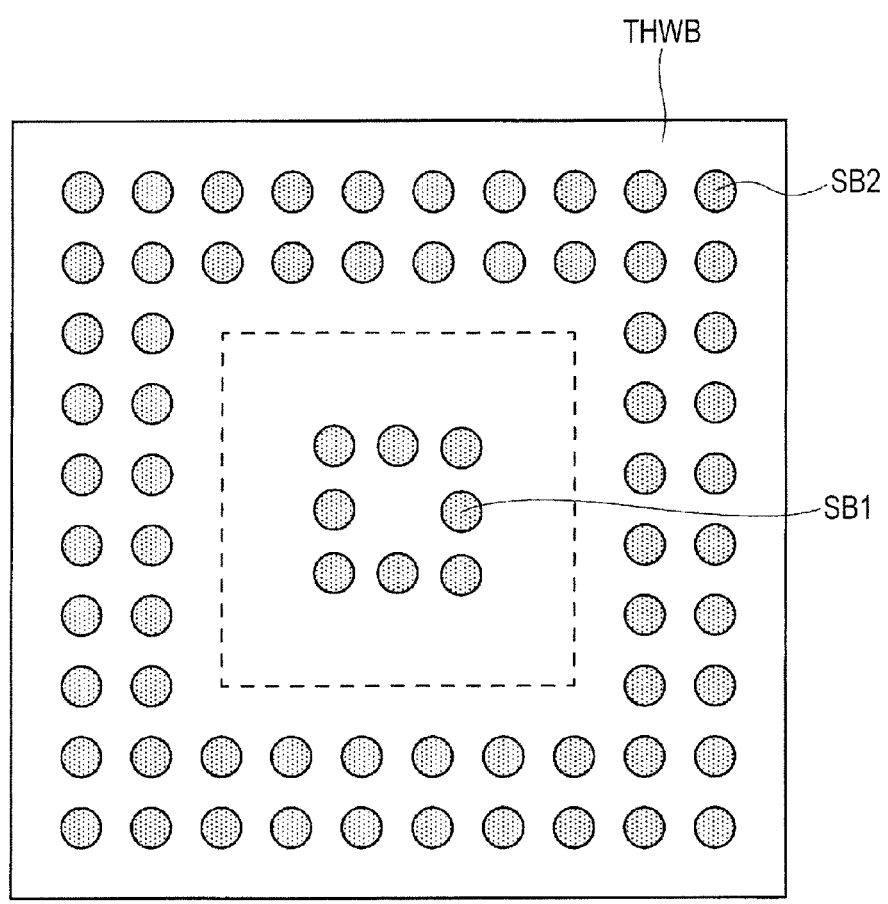
FIG. 29 is a plan view showing the configuration of a through-hole wiring board according to Modification Example 5.

FIG. 29 is a plan view showing the configuration of a through-hole wiring board THWB according to the present modification example 5. FIG. 29 shows the back surface of the through-hole wiring board THWB. In FIG. 29, a plurality of solder balls SB2 is placed in an outer area of the rectangular through-hole wiring board THWB. A chip mounting area is formed so as to be embraced in the outer area having therein the solder balls SB. This chip mounting area has, in the inner area thereof, a plurality of solder balls SB1.

In FIG. 29, the present modification example 5 is characterized by that the lands having thereon the solder balls SB1 and the lands having thereon the solder balls SB2 which are placed on the back surface of the through-hole wiring board THWB have an NSMD structure. In short, in FIG. 29, all the lands placed on the back surface of the through-hole wiring board THWB have an NSMD structure. More specifically, FIG. 29 shows that the lands corresponding to the dotted solder balls SB1 and the dotted solder balls SB2 have an NSMD structure. Thus, according to the present modification example 5, all the lands placed on the back surface of the through-hole wiring board THWB employ NSMD as a configuration mode. In NSMD, therefore, the lands are brought into contact with the solder balls SB1 or solder balls SB2 not only at the bottom surface but also at the side surface of the lands so that the bond strength between the lands and the solder balls SB1 or between the lands and the solder balls SB2 can be improved.

It is possible to use NSMD for only the lands having thereon the solder balls placed in an area overlapping with the chip mounting area in a plan view because the greatest stress is put on the solder balls placed in an area overlapping with the chip mounting area in a plan view. In other words, it seems unnecessary to use NSMD for the lands on which solder balls placed in an outer area not overlapping with the chip mounting area in a plan view are to be mounted.

In this case, the configuration mode of the lands is NSMD in the inner area of the chip mounting area, while the configuration mode of the lands is SMD in the outer area of the chip mounting area. This means that lands of two configuration modes are present. If so, the following problem may presumably occur. Described specifically, when the solder balls mounted on the lands having an NSMD structure and the solder balls mounted on the lands having an SMD structure are adjusted to have the same size, solder flows along and brought into contact with not only the bottom surface but also the side surface of the lands. On the other hand, when the lands have an SMD structure, solder is brought into contact with only the bottom surface of them. As a result, in the lands having an NSMD structure, due to the solder running along even the side surface of the lands, the height (finish height) of the solder balls mounted on the lands having an NSMD structure may presumably become lower than the height (finish height) of the solder balls mounted on the lands having an SMD structure. This means that the height of the solder balls formed on the back surface of the through-hole wiring board THWB varies. This may lead to a coupling failure between the through-hole wiring board THWB and the mounting substrate via these solder balls.

In the present modification example 5, on the other hand, all the lands formed on the back surface of the through-hole wiring board THWB uniformly have an NSMD structure so that variation in the height of these solder balls due to the presence of both NSMD and SMD does not occur. The present modification example 5 therefore gives the advantage of improving the coupling reliability between the through-hole wiring board THWB and the mounting substrate via solder balls. In particular, the present modification example 5 is markedly effective for reducing the variation in the height of the solder balls mounted on the back surface of the through-hole wiring board THWB while improving the bond strength between the lands and balls placed in an area which overlaps with the chip mounting area in a plan view and tends to be subjected to a large stress.

Advantage of Embodiments

According to the present embodiment, NSMD is employed as the configuration mode of the lands placed in at least an area of the back surface of the through-hole wiring board overlapping with the chip mounting area in a plan view. In NSMD, the lands are brought into contact with the solder balls not only at the bottom surface but also the side surface of the lands so that bond strength between the lands and solder balls can be improved. As a result, the present embodiment makes it possible to effectively suppress the fracture and separation of the solder balls from the lands, even if a stress due to temperature cycling is put on the solder balls which couple the through-hole wiring board to the mounting substrate. The semiconductor device according to the present embodiment therefore has improved reliability.

More specifically, it has been confirmed that the life of the semiconductor device of the present embodiment mounted on a mounting substrate becomes longer than the life of a semiconductor device, to which the technical concept of the present embodiment has not been applied, mounted on a mounting substrate. For example, at a temperature cycling test at −40° C. and at 125° C., when the semiconductor device, to which the technical concept of the present embodiment has not been applied, is mounted on a mounting substrate, fracture and separation of a solder ball from a land occurred after 700 cycles. On the other hand, when the semiconductor device of the present embodiment is mounted on a mounting substrate, fracture and separation of a solder ball from a land did not occur even after 1000 cycles. The results have demonstrated that according to the present embodiment, a semiconductor device having improved reliability can be provided. The usefulness of the technical concept of the present embodiment is therefore confirmed.

<Manufacturing Method of Semiconductor Device According to Embodiment>

The semiconductor device according to the present embodiment has the above-mentioned configuration and a manufacturing method of it will hereinafter be described referring to some drawings.

Figure 30:
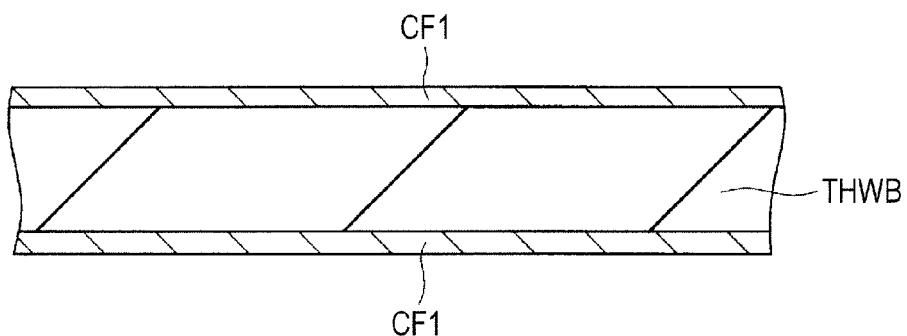
FIG. 30 is a cross-sectional view showing a manufacturing step of the through-hole wiring board according to the embodiment.
Figure 31:
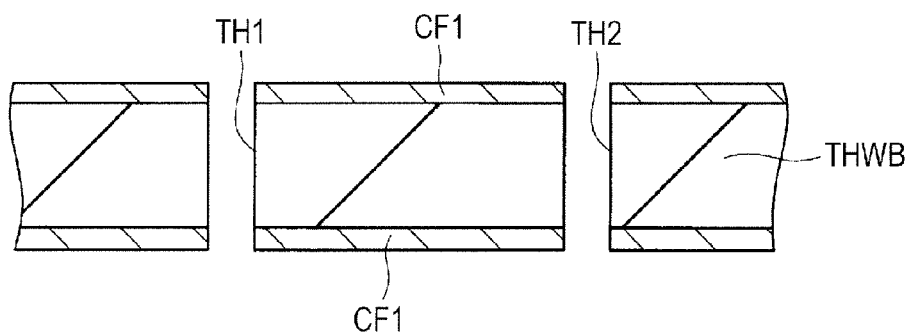
FIG. 31 is a cross-sectional view showing a manufacturing step of the through-hole wiring board following the step shown in FIG. 30.

As shown in FIG. 30, a through-hole wiring board THWB having both surfaces attached with a conductive film CF1 made of a copper foil is provided. The through-hole wiring board THWB is made of a base material, for example, a glass BT material or a glass heat-resistant epoxy material. Then, as shown in FIG. 31, a through-hole TH1 and a through-hole TH2 are formed in a through-hole formation area. The through-hole TH1 and the through-hole TH2 are bored using a drill and they are formed so as to penetrate through the through-hole wiring board THWB attached, on both surfaces thereof, with the conductive film CF1.

Figure 32:
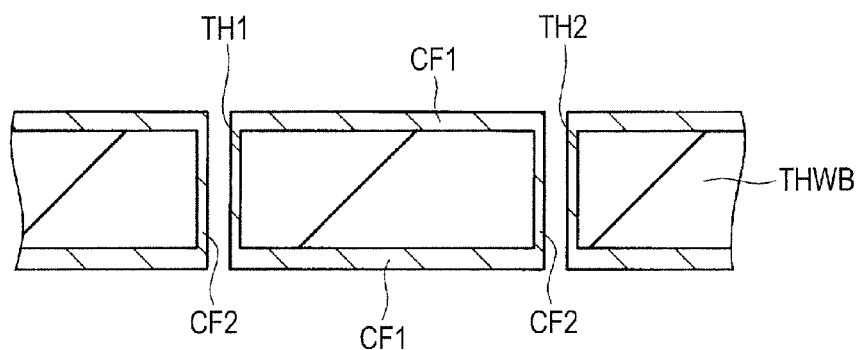
FIG. 32 is a cross-sectional view showing a manufacturing step of the through-hole wiring board following the step shown in FIG. 31.

Next, as shown in FIG. 32, a conductive film CF2 made of a copper plating film is formed on both surfaces of the conductive film CF1 attached to the through-hole wiring board THWB. The conductive film CF2 made of a copper plating film can be formed, for example, by electroless plating or electroplating. The conductive film CF2 made of this copper plating film is also formed on the side surface of the through-hole TH1 and the side surface of the through-hole TH2, each through-hole penetrating through the through-hole wiring board THWB. It is to be noted that although the conductive film CF2 is formed also on the conductive film CF1 formed on both surfaces of the through-hole wiring board THWB, the conductive film CF1 and the conductive film CF2 will be described integrally as a conductive film CF1 in the drawings of FIG. 32 and thereafter.

Figure 33:
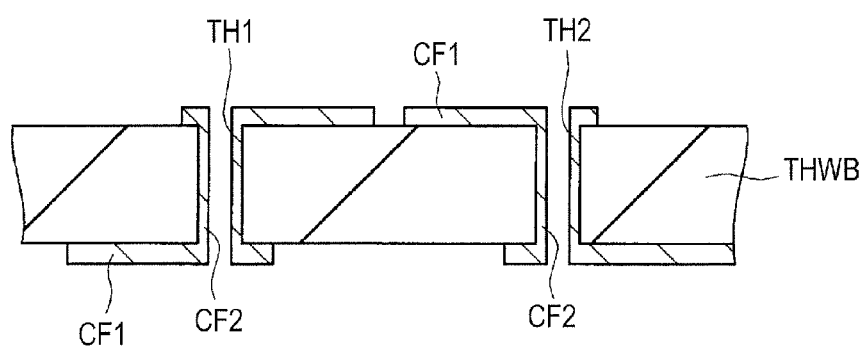
FIG. 33 is a cross-sectional view showing a manufacturing step of the through-hole wiring board following the step shown in FIG. 32.

Next, as shown in FIG. 33, the conductive films CF1 formed on the surface and back surface of the through-hole wiring board THWB are patterned successively by using photolithography and etching.

Figure 34:
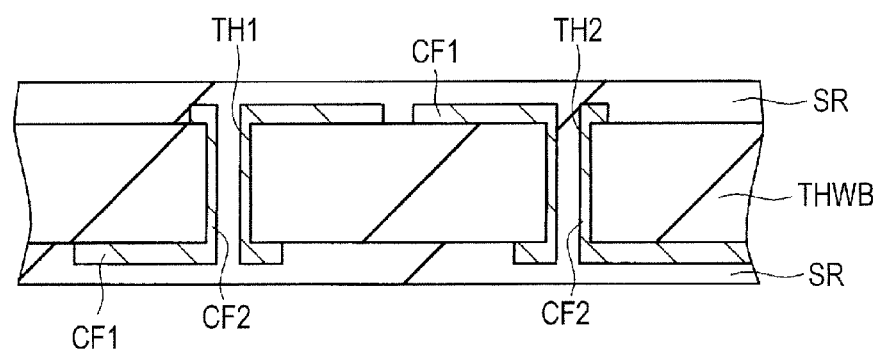
FIG. 34 is a cross-sectional view showing a manufacturing step of the through-hole wiring board following the step shown in FIG. 33.

Next, as shown in FIG. 34, a solder resist SR is applied onto both surfaces of the through-hole wiring board THWB. In order to apply the solder resist SR to the both surfaces of the through-hole wiring board THWB, first, the solder resist SR is applied to one of the surfaces of the through-hole wiring board THWB, followed by interim drying. After completion of the interim drying of the solder resist SR, the solder resist SR is applied onto the other surface of the through-hole wiring board THWB, followed by interim drying. The solder resist SR can therefore be formed on both surfaces of the through-hole wiring board THWB. As a result, on the surface (upper surface) and the back surface (lower surface) of the through-hole wiring board THWB, the patterned conductive film CF1 is covered with the solder resist SR.

Figure 35:
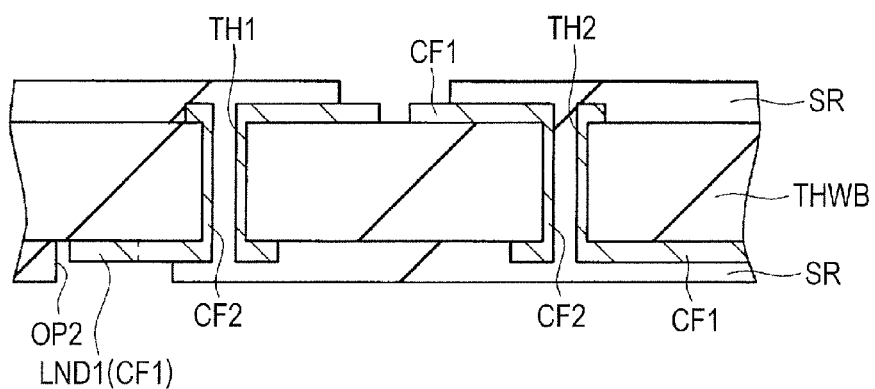
FIG. 35 is a cross-sectional view showing a manufacturing step of the through-hole wiring board following the step shown in FIG. 34.

Next, as shown in FIG. 35, an opening portion OP2 is formed in the solder resist SR by using photolithography. This means that the opening portion OP2 is formed in the back surface (lower surface) of the through-hole wiring board THWB. This opening portion OP2 is formed so as to expose a land LND1 formed on the back surface (lower surface) of the through-hole wiring board THWB. More specifically, the opening portion OP2 is formed so that it has a diameter greater than that of the land LND1 and at the same time, the opening portion OP2 is formed so as to embrace therein the land LND1 in a plan view. This makes it possible to employ NSMD as a configuration mode of the land LND1 formed on the back surface (lower surface) of the through-hole wiring board THWB. After main curing (main drying) of the solder resist SR, a nickel/gold plating film is formed on the land LND1 exposed from the opening portion OP2. In such a manner, terminals plated with a nickel/gold film can be formed on the land LND1. Then, the resulting through-hole wiring board THWB is washed, followed by visual inspection to complete the through-hole wiring board THWB. In such a manner, the through-hole wiring board THWB according to the present embodiment can be manufactured.

Figure 36:
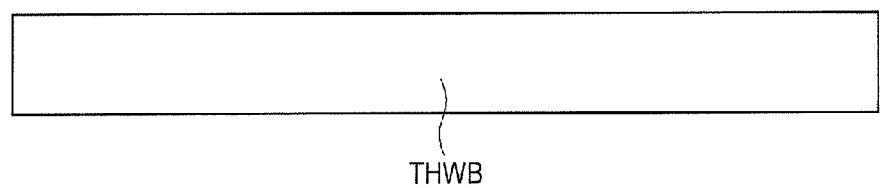
FIG. 36 is a schematic view showing a manufacturing step of the semiconductor device according to the embodiment.

Next, as shown in FIG. 36, the through-hole wiring board THWB manufactured by the above-mentioned manufacturing steps is provided. This through-hole wiring board THWB has a layout configuration, for example, as shown in FIG. 7 and has terminals TE1 and TE2, through-holes TH1, TH2, and TH3, and the like.

Figure 37:
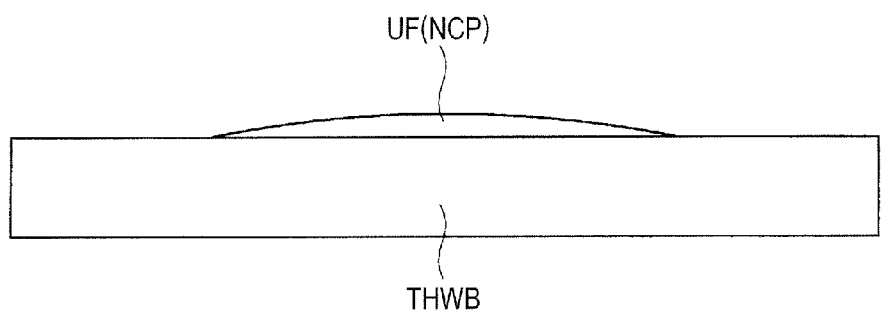
FIG. 37 is a schematic view showing a manufacturing step of the semiconductor device following the step shown in FIG. 36.

As shown in FIG. 37, an underfill UF is applied to a chip mounting area on the surface of the through-hole wiring board THWB. As the under fill UF, a quick-curing resin NCP (Non-Conductive Paste) is recommended.

Figure 38:
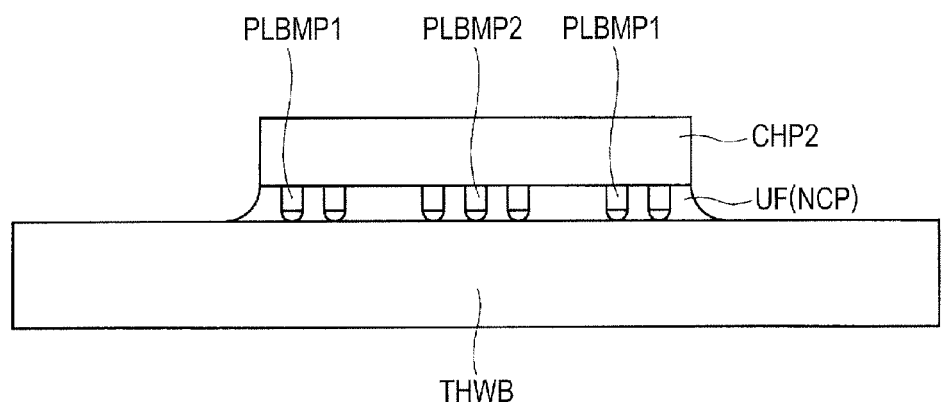
FIG. 38 is a schematic view showing a manufacturing step of the semiconductor device following the step shown in FIG. 37.

Then, as shown in FIG. 38, a semiconductor chip CHP2 is mounted on the through-hole wiring board THWB. This semiconductor chip CHP2 has, on the surface (main surface) thereof, a pillared bump electrode PLBMP1 and a pillared bump electrode PLBMP2, for example, as shown in FIG. 4. The semiconductor chip CHP2 is then mounted on the through-hole wiring board THWB so that the pillared bump electrode PLBMP1 (PLBMP2) formed on the semiconductor chip CHP2 is brought into direct contact with the terminal (not shown) formed on the through-hole wiring board THWB, followed by heating to a high temperature. As a result, the solder of the pillared bump electrode PLBMP1 (PLBMP2) is melted to electrically couple the terminal TE1 (TE2) on the through-hole wiring board THWB to the copper of the pillared bump electrode PLBMP1 (PLBMP2). At this time, the underfill UF spreads in a wet state and fills the space between the semiconductor chip CHP2 and the through-hole wiring board THWB. In addition, a quick curing resin NCP is used as the underfill UF so that the underfill UF is cured.

In the present embodiment, the pillared bump electrode PLBMP1 (PLBMP2) whose height can be secured even if its size is reduced is used for coupling the semiconductor chip CHP2 to the through-hole wiring board THWB so that the spreading of the underfill UF in a wet state is not inhibited.

Figure 39:
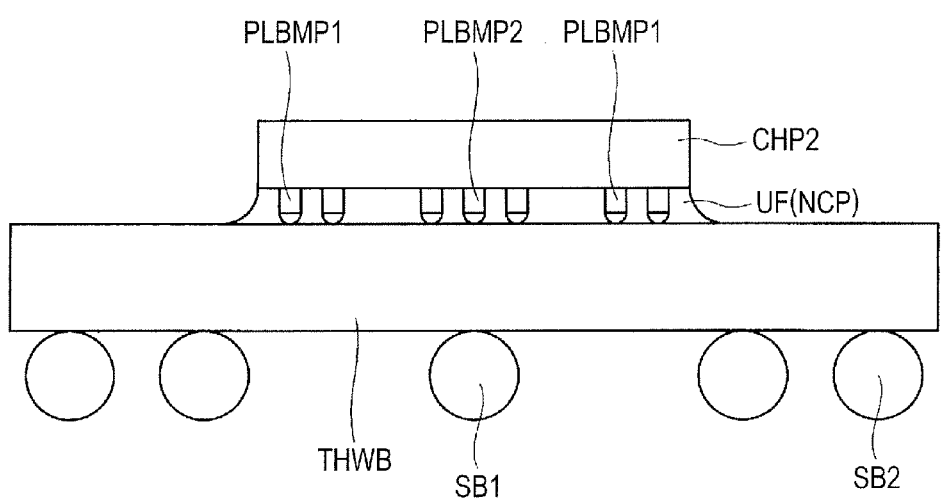
FIG. 39 is a schematic view showing a manufacturing step of the semiconductor device following the step shown in FIG. 38.

Next, as shown in FIG. 39, solder balls SB are mounted on the back surface (surface on the side opposite to the chip mounting surface) of the through-hole wiring board THWB. In particular, in the present embodiment, solder balls SB2 are mounted in an outer area of the chip mounting area and solder balls SB1 are mounted in an inner area of the chip mounting area. More specifically, the solder balls SB1 and the solder balls SB2 are mounted on lands formed on the through-hole wiring board THWB. In the present embodiment, the lands formed in at least an area overlapping with the chip mounting area in a plan view have an NSMD structure so that the bond strength between the lands and the solder ball SB1 can be improved in this area. In the above-mentioned manner, the semiconductor device of the present embodiment can be manufactured.

Then, the semiconductor device of the present embodiment is mounted on a mounting substrate via the solder balls SB1 and solder balls SB2. With the semiconductor device mounted on the mounting substrate, a temperature cycling test after mounting is performed. In this reliability test (temperature cycling test after mounting), the solder balls SB1 placed in an area overlapping with the chip mounting area in a plan view tend to cause fracture and separation from the lands due to a difference in thermal expansion coefficient between the semiconductor chip CHP2 and the through-hole wiring board THWB. In the present embodiment, however, NSMD is used as a configuration mode of the lands placed in at least an area overlapping with the chip mounting area in a plan view.

According to the present embodiment, the lands are brought into contact with the solder balls not only at the bottom surface but also the side surface of the lands so that the bond strength between the lands and the solder balls can be improved. As a result, according to the present embodiment, fracture and separation of the solder balls from the lands can effectively be suppressed even if a stress due to temperature cycling is applied to the solder balls with for coupling the through-hole wiring board to the mounting substrate. According to the present embodiment, a semiconductor device having improved reliability can be provided.

The invention made by the present inventors has so far been described specifically based on its embodiment. It should however be borne in mind that the invention is not limited to or by the embodiment. Needless to say, it can be changed without departing from the gist of the invention.

What is claimed is:

1. A semiconductor device comprising:
   (a) a semiconductor chip having, over a surface thereof, a plurality of protruding electrodes;
   (b) a wiring board having a first main surface over which the semiconductor chip is mounted and a plurality of terminals is placed and a second main surface which is on the side opposite to the side of the first main surface and has a plurality of lands electrically coupled to the terminals, respectively, the protruding electrodes of the semiconductor chip being electrically coupled to the terminals, respectively; and
   (c) a sealing resin filled between the semiconductor chip and the wiring board, wherein the wiring board comprises:
      (b1) an insulating film formed over the second main surface;
      (b2) among the terminals, a plurality of first terminals and a plurality of second terminals placed in a first area of the wiring board;
      (b3) a plurality of first through-holes placed in a second area inside the first area and electrically coupled to the first terminals, respectively;
      (b4) among the lands, a plurality of first lands electrically coupled to the first through-holes, respectively, and placed so as to overlap with the second area in a plan view;
      (b5) a plurality of second through-holes placed in a third area outside the first area and electrically coupled to the second terminals, respectively; and
      (b6) among the lands, a plurality of second lands electrically coupled to the second through-holes, respectively, and placed so as to overlap with the third area in a plan view,
   wherein the insulating film has therein a plurality of openings,
   wherein the first lands are placed so as to overlap with the semiconductor chip in a plan view, and
   wherein the first lands are embraced in the openings, respectively.

2. The semiconductor device according to claim 1,
   wherein among the second lands, some of the second lands are placed so as to overlap with the semiconductor chip in a plan view, and
   wherein the some of the second lands are embraced in the openings, respectively.

3. The semiconductor device according to claim 2, wherein among the second lands placed on the outside of the semiconductor chip in a plan view, second lands closest to the outer edge portion of the semiconductor chip are embraced in the openings, respectively.

4. The semiconductor device according to claim 1, wherein all the first lands and all the second lands are embraced in the openings, respectively.

5. The semiconductor device according to claim 1,
wherein the first lands include, among the first lands, a first external land placed at the outermost periphery,
wherein the second lands include, among the second lands, a second internal land placed at the innermost periphery and adjacent to the first external land, and
wherein a distance between the first external land and the second internal land is greatest among distances between the lands adjacent to each other.

6. The semiconductor device according to claim 5, wherein the semiconductor chip is mounted over the first main surface of the wiring board so that the outer edge portion of the semiconductor chip is located between the first external land and the second internal land in a plan view.

7. The semiconductor device according to claim 1, wherein the first area has therein no through-hole in a plan view.

8. The semiconductor device according to claim 7, wherein the first lands and the second lands are placed so as not to overlap with the first area in a plan view.

9. The semiconductor device according to claim 8, wherein an area overlapping with the first area has therein no lands in a plan view.

10. The semiconductor device according to claim 1, wherein the number of the first lands is smaller than the number of the second lands.

11. The semiconductor device according to claim 1, wherein the first terminals are placed on an inner side of the wiring board than the second terminals.

12. The semiconductor device according to claim 1,
wherein the lands have a first surface having the same direction as that of the second main surface of the wiring board, a second surface on the side opposite to the first surface, and a side surface located between the first surface and the second surface in the thickness direction of the wiring board, and
wherein the first surface and the side surface of the first lands is in contact with a solder.

13. The semiconductor device according to claim 1, wherein the first lands are supplied with a power supply potential or a reference potential from the outside of the semiconductor device.

14. The semiconductor device according to claim 1, wherein neither a portion of the back surface of the semiconductor chip which is opposite to the surface nor a portion of the first main surface of the wiring board is covered with the sealing resin.

15. The semiconductor device according to claim 1, wherein the thickness of the wiring board is greater than the thickness of the semiconductor chip.

16. The semiconductor device according to claim 15,
wherein the wiring board contains, inside thereof, a core material, and
wherein the thickness of the core material is 1.2 times or more but not more than 2 times the thickness of the semiconductor chip.

* * * * *